(12) United States Patent
Saitou et al.

(10) Patent No.: US 9,385,334 B2
(45) Date of Patent: Jul. 5, 2016

(54) ORGANIC ELECTROLUMINESCENCE LIGHT-EMITTING DEVICE AND PRODUCTION METHOD THEREOF

(71) Applicant: MITSUBISHI CHEMICAL CORPORATION, Chiyoda-ku (JP)

(72) Inventors: Keiko Saitou, Kanagawa (JP); Yoshimasa Bando, Kanagawa (JP); Atsushi Takahashi, Kanagawa (JP); Hideaki Okamoto, Kanagawa (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 0 days.

(21) Appl. No.: 14/173,002

(22) Filed: Feb. 5, 2014

(65) Prior Publication Data

US 2014/0151671 A1    Jun. 5, 2014

Related U.S. Application Data

(63) Continuation of application No. PCT/JP2012/069762, filed on Aug. 2, 2012.

(30) Foreign Application Priority Data

Aug. 5, 2011 (JP) .................................. 2011-172178

(51) Int. Cl.
*H01L 51/50* (2006.01)
*H01L 51/56* (2006.01)
*H01L 51/52* (2006.01)

(52) U.S. Cl.
CPC ............ *H01L 51/50* (2013.01); *H01L 51/5246* (2013.01); *H01L 51/5259* (2013.01);

(Continued)

(58) Field of Classification Search
CPC .................................. H01L 51/50; H01L 51/56
USPC ................................................. 257/40; 438/46
See application file for complete search history.

(56) References Cited

U.S. PATENT DOCUMENTS

2002/0015818 A1* 2/2002 Takahashi et al. .............. 428/76
2002/0068191 A1   6/2002 Kobayashi
(Continued)

FOREIGN PATENT DOCUMENTS

JP    2001-307871 A    11/2001
JP    2002-175877 A     6/2002
(Continued)

OTHER PUBLICATIONS

International Search Report issued Aug. 28, 2012 in PCT/JP2012/069762 (with English language translation).

(Continued)

*Primary Examiner* — Jerome Jackson, Jr.
*Assistant Examiner* — Lamont Koo
(74) *Attorney, Agent, or Firm* — Oblon, McClelland, Maier & Neustadt, L.L.P.

(57) ABSTRACT

An object of the present invention is to provide an organic EL light-emitting device in which a permeation and diffusion of moisture from outside are prevented and a stable light-emitting characteristic is able to be maintained for a long period. The present invention relates to an organic EL light-emitting device comprising a sealing layer, a hygroscopic layer and a protective layer, which are aligned on the back of an organic electroluminescence element under a predetermined condition, wherein the sealing layer and the protective layer are constituted from a specific material, whereby it is possible to maintain a stable light-emitting characteristic for a long period together with suppressing the deterioration caused by moisture being permeated from outside.

13 Claims, 8 Drawing Sheets

(52) U.S. Cl.
    CPC ............... *H01L51/56* (2013.01); *H01L 51/529* (2013.01); *H01L 51/5243* (2013.01); *H01L 51/5253* (2013.01); *H01L 2251/558* (2013.01)

(56) References Cited

U.S. PATENT DOCUMENTS

| | | |
|---|---|---|
| 2004/0065877 A1 | 4/2004 | Hayashi et al. |
| 2004/0104673 A1 | 6/2004 | Hosokawa et al. |
| 2005/0045900 A1 | 3/2005 | Silvernail |
| 2006/0100299 A1* | 5/2006 | Malik et al. .................. 522/31 |
| 2007/0152212 A1 | 7/2007 | Cho et al. |
| 2007/0172971 A1 | 7/2007 | Boroson |
| 2007/0298672 A1* | 12/2007 | Iida .................................. 445/1 |
| 2008/0185960 A1 | 8/2008 | Koshiyama |
| 2008/0231175 A1* | 9/2008 | Sung et al. .................. 313/504 |
| 2009/0134786 A1* | 5/2009 | Matsuzaki et al. ............ 313/504 |
| 2010/0102302 A1* | 4/2010 | Kase et al. .................... 257/40 |
| 2010/0140644 A1 | 6/2010 | Kai et al. |
| 2010/0300746 A1 | 12/2010 | Mackenzie et al. |
| 2010/0327275 A1 | 12/2010 | Saito et al. |
| 2011/0244607 A1 | 10/2011 | Cho et al. |
| 2012/0313514 A1 | 12/2012 | Kai et al. |
| 2013/0105783 A1 | 5/2013 | Saito et al. |

FOREIGN PATENT DOCUMENTS

| | | |
|---|---|---|
| JP | 2002-237390 A | 8/2002 |
| JP | 2003-168555 A | 6/2003 |
| JP | 2003-187962 A | 7/2003 |
| JP | 2003-323975 A | 11/2003 |
| JP | 2004-095503 A | 3/2004 |
| JP | 2004-171806 A | 6/2004 |
| JP | 2004-303528 A | 10/2004 |
| JP | 2004-303529 A | 10/2004 |
| JP | 2006-080094 A | 3/2006 |
| JP | 2007-123102 A | 5/2007 |
| JP | 2007-184279 A | 7/2007 |
| JP | 2008-010211 A | 1/2008 |
| JP | 2008-034142 A | 2/2008 |
| JP | 2008-181832 A | 8/2008 |
| JP | 2008-210788 A | 9/2008 |
| JP | 2010-055861 A | 3/2010 |
| JP | 2010-080289 A | 4/2010 |
| JP | 2010-102994 A | 5/2010 |
| JP | 2010-135182 A | 6/2010 |
| JP | 2011-009076 A | 1/2011 |
| TW | 2007-33792 A | 9/2007 |
| WO | WO 2007/087157 A1 | 8/2007 |
| WO | WO 2009/107201 A1 | 9/2009 |

OTHER PUBLICATIONS

U.S. Appl. No. 14/636,842, filed Mar. 3, 2015, Bando, et al.
European Search Report mailed Jun. 18, 2015 in corresponding European Patent Application No. 12822555 filed Aug. 2, 2012.
Office Action Issued Aug. 24, 2015, in Chinese Patent Application No. 201280037760.9 filed Aug. 2, 2012 (with English translation).
Office Action issued Apr. 26, 2016, in Taiwanese Patent Application No. 101127969 (with English translation).

\* cited by examiner (a)

(b)

(c)

(a)

(b)

(c)

(d)

(a)

(b)

(c)

(d)

(a)

(b)

(c)

(d)

(a)

(b)

(c)

ORGANIC ELECTROLUMINESCENCE LIGHT-EMITTING DEVICE AND PRODUCTION METHOD THEREOF

TECHNICAL FIELD

The present invention relates to an organic electroluminescence (hereinafter referred to also as "organic EL") light-emitting device and a process for producing the device.

BACKGROUND ART

An organic EL light-emitting device is a device equipped with an organic electroluminescence element obtained, for example, by successively superposing a translucent substrate, such as a glass or a plastic, an anode constituted of a transparent electrode, an organic functional layer constituted of an organic thin film, and a cathode. Such organic EL light-emitting devices suitable for practical use are being developed enthusiastically in recent years for the reasons, for example, that these light-emitting devices emit light areally at high luminance with a voltage as low as several volts and that it is possible to make the devices emit light in any desired color tone by selecting luminescent substances.

It is known that when an organic EL light-emitting device is allowed to stand, with the organic functional layer and the cathode being exposed to the air, the device undergoes a phenomenon (shrinking) in which the non-luminescent region expands due to atmospheric moisture as if the luminescent region of the organic functional layer shrinks, resulting in a deterioration of the organic electroluminescence element. Consequently, a sealing structure for blocking moisture is necessary. A hollow seal obtained by bonding a glass or metallic sealing can 17 for moisture blocking to the back of an organic electroluminescence element by means of an adhesive 15 to form a hollow structure and disposing a desiccant 16 within the sealing can 17, as shown in, for example, FIG. 6, has hence been proposed.

In the case of this hollow seal, however, since the deterioration is prevented by causing the desiccant to absorb the moisture which has permeated from outside the seal, an expensive member which is made of a glass, metal, etc. and in which a recessed portion for placing the desiccant therein has been formed in the center is necessary as a sealing base. In addition, because of the space inside the seal, the heat generated by the luminescence is less apt to be dissipated and there is a fear that the life of the organic electroluminescence element may be shortened. Furthermore, a prolonged tact time is necessary for applying the resin used for bonding the periphery of the sealing base. In the case of using a glass frit, an expensive apparatus such as a laser is necessary.

Under these circumstances, techniques of solid sealing have been proposed in which a layer of an adhesive is directly formed on an electrode and a flat glass plate or metal foil, as a sealing base, is fixed through the adhesive, for the purposes of a cost reduction, improvement in heat dissipation property, and reductions in thickness and weight. Examples thereof include a solid seal obtained by disposing a dehydrating agent including an alkaline earth metal, e.g., Ca, around the luminescent region of an organic electroluminescence element, sealing the surfaces thereof with an epoxy resin, and fixing a glass plate disposed thereon (patent document 1) and a solid seal obtained by sealing an area including and larger than the cathode of an organic electroluminescence element with an ultraviolet-curable resin which contains a crystalline zeolite and bonding a sealing substrate to the surface thereof (patent document 2).

PRIOR-ART DOCUMENTS

Patent Documents

Patent Document 1: JP-A-2006-80094
Patent Document 2: JP-A-2010-55861

SUMMARY OF THE INVENTION

Problems that the Invention is to Solve

However, the sealing structure described in patent document 1 has a drawback that although a thin desiccant layer is formed around the luminescent region of an organic electroluminescence element by vapor-depositing an alkaline earth metal, e.g., Ca, the alkaline earth metal, e.g., Ca, has exceedingly high reactivity and is hence highly dangerous. In addition, since the step of vapor deposition on a substrate is newly necessary, the apparatus cost increases and the production period is prolonged. Meanwhile, the sealing structure described in patent document 2 has had a problem that since the moisture absorbent mixed with an adhesive is exposed to the air, the moisture-absorbing performance of the desiccant is apt to deteriorate from the outer surface.

Accordingly, a subject for the invention is to provide an organic EL light-emitting device in which moisture permeation from outside and moisture diffusion are prevented and which can retain stable luminescent properties for a long period. Another subject for the invention is to provide a process for producing an organic EL light-emitting device, the process being capable of efficiently producing such an organic EL light-emitting device through simpler steps.

Means for Solving the Problems

The present inventors made investigations in view of those problems and, as a result, have found that an organic EL light-emitting device which is inhibited from being deteriorated by moisture that has permeated from outside and which can retain stable luminescent properties for a long period is obtained by disposing a sealing layer, a hygroscopic layer, and a protective layer on the back of an organic electroluminescence element under given conditions and constituting the sealing layer and the protective layer from specific materials.

Essential points of the invention are as follows.

<1> An organic electroluminescence light-emitting device which comprises: a translucent substrate; a first electrode formed on the translucent substrate; an organic functional layer formed on the first electrode and including at least a luminescent layer; a second electrode formed on the organic functional layer; a sealing layer which comprises a thermoplastic resin and has been formed so as to cover at least the surfaces of the first electrode, second electrode and organic functional layer; a protective layer having flexibility and formed over the sealing layer; and a hygroscopic layer which contains a desiccant and which has been disposed between the protective layer and the sealing layer and formed so as to surround at least a luminescent region of the luminescent layer, wherein the edge of the hygroscopic layer protrudes, along a horizontal direction, from the edge of the luminescent region by 0.4 mm or longer and is shorter than the edge of the sealing layer.

<2> The organic electroluminescence light-emitting device according to the <1> above, wherein that thickness of the protective layer which is located over the luminescent region is at least 0.3 times the thickness of the sealing layer which is located over the luminescent region.

<3> The organic electroluminescence light-emitting device according to the <1> or <2> above, wherein that region of the sealing layer where the hygroscopic layer is not formed, has a thickness that is smaller than the thickness of the sealing layer which is located over the luminescent region.

<4> The organic electroluminescence light-emitting device according to any one of the <1> to <3> above, wherein the horizontal distance from the edge of the hygroscopic layer to the edge of the sealing layer is 0.1 mm or longer.

<5> The organic electroluminescence light-emitting device according to any one of the <1> to <4>, wherein the hygroscopic layer contains at least one member selected from alkaline earth metals, alkali metals and oxides thereof, and inorganic porous materials.

<6> The organic electroluminescence light-emitting device according to any one of the <1> to <5> above, wherein the hygroscopic layer has a thickness of 0.1-500 μm.

<7> The organic electroluminescence light-emitting device according to any one of the <1> to <6> above, wherein the sealing layer has a thickness of 1-200 μm.

<8> The organic electroluminescence light-emitting device according to any one of the <1> to <6> above, wherein the sealing layer has a thickness of 10-100 μm.

<9> The organic electroluminescence light-emitting device according to any one of the <1> to <6> above, wherein the protective layer has a thickness of 10-200 μm.

<10> A process for producing an organic electroluminescence light-emitting device, the process comprising the following steps in the following order: an element formation step in which an organic functional layer including at least a luminescent layer is formed on the first electrode of a translucent substrate having a first electrode formed thereon, and a second electrode is subsequently formed on the organic functional layer to obtain an organic electroluminescence element; a step in which a hygroscopic layer containing a desiccant is formed on a flexible sheet serving as a protective layer; a backing member formation step in which a sealing layer having a thickness of 3.3 times or less the thickness of the protective layer and comprising a thermoplastic resin is formed on the hygroscopic layer to obtain a backing member; and a heat treatment step in which the surface of the organic electroluminescence element on which the second electrode has been formed and the surface of the backing member on which the sealing layer has been formed, are superimposed and heat-treated, so that the hygroscopic layer surrounds at least a luminescent region of the luminescent layer and that the edge of the hygroscopic layer protrudes, along a horizontal direction, from the edge of the luminescent region of the luminescent layer by 0.4 mm or more.

<11> An organic electroluminescence light-emitting device produced by a production process which comprises the following steps in the following order: an element formation step in which an organic functional layer including at least a luminescent layer is formed on the first electrode of a translucent substrate having a first electrode formed thereon, and a second electrode is subsequently formed on the organic functional layer to obtain an organic electroluminescence element; a step in which a hygroscopic layer containing a desiccant is formed on a flexible sheet serving as a protective layer; a backing member formation step in which a sealing layer having a thickness of 3.3 times or less the thickness of the protective layer and comprising a thermoplastic resin is formed on the hygroscopic layer to obtain a backing member; and a heat treatment step in which the surface of the organic electroluminescence element on which the second electrode has been formed and the surface of the backing member on which the sealing layer has been formed, are superimposed and heat-treated, so that the hygroscopic layer surrounds at least a luminescent region of the luminescent layer and that the edge of the hygroscopic layer protrudes, along a horizontal direction, from the edge of the luminescent region of the luminescent layer by 0.4 mm or more.

<12> An organic electroluminescence display device which employs the organic electroluminescence light-emitting device according to the <11> above.

<13> An organic electroluminescence lighting device which employs the organic electroluminescence light-emitting device according to the <11> above.

<14> An organic electroluminescence electrical apparatus which employs the organic electroluminescence light-emitting device according to the <11> above.

Effect of the Invention

The organic EL light-emitting device according to the invention is excellent in terms of not only the property of blocking external moisture but also heat dissipation property and, hence, the organic electroluminescence element is inhibited from deteriorating. As a result, the device can retain stable luminescent properties for a long period. Moreover, the organic EL light-emitting device of the invention can be made to have a smaller weight and a smaller thickness as compared with conventional organic EL light-emitting devices, and it is also possible to recycle the substrate.

Furthermore, according to the invention, such an organic EL light-emitting device can be efficiently produced through simpler steps.

BRIEF DESCRIPTION OF THE DRAWINGS

FIG. 3 (*a*) is a view illustrating a state in which a first electrode 2 has been formed on a surface of a translucent substrate 1; FIG. 3 (*b*) is a view illustrating a state in which an organic functional layer 3 including a luminescent layer has been formed on the first electrode 2; and FIG. 3 (*c*) is a view illustrating a state in which a second electrode 4 has been formed on the organic functional layer 3.

FIG. 4 (*a*) is a view that shows a flexible sheet serving as a protective layer 7; FIG. 4 (*b*) is a view that shows a state in which a hygroscopic layer 6 has been formed on the surface of the protective layer 7 in a matrix arrangement; FIG. 4 (*c*) is a view that shows one of individual pieces obtained by cutting the protective layer 7;

and FIG. 4 (d) is a view that shows a state in which a sealing layer 5 including a thermoplastic resin has been formed on the hygroscopic layer 6.

FIG. 5 (a) is a view that shows a flexible sheet serving as a protective layer 7; FIG. 5 (b) is a view that shows a state in which a hygroscopic layer 6 has been formed on the surface of the protective layer 7 in a matrix arrangement; FIG. 5 (c) is a view that shows one of individual pieces obtained by cutting the protective layer 7; and FIG. 5 (d) is a view that shows a state in which a sealing layer 5 including a thermoplastic resin has been formed on the hygroscopic layer 6.

FIG. 7 (a) is a view that shows a state in which a hygroscopic layer 6 has been formed on a protective layer 7; FIG. 7 (b) is a view that shows a state in which the two-layer structure is placed so that the hygroscopic layer 6 faces downward; FIG. 7 (c) is a view that shows a state in which that portion of the protective layer 7 on which the hygroscopic layer 6 was not disposed has been pressed; and FIG. 7 (d) is a view that shows a state in which a sealing layer 5 has been formed on the flat surface where the protective layer 7 is substantially flush with the hygroscopic layer 6.

FIG. 8 (a) is a view that shows a state in which a backing member has been superposed on an organic EL element; FIG. 8 (b) is a view that shows hot pressing; and FIG. 8 (c) is a view that shows the organic EL element which has undergone the hot pressing.

MODES FOR CARRYING OUT THE INVENTION

Preferred embodiments of the organic EL light-emitting device of the invention are explained below in detail by reference to the drawings. In the explanations of the drawings, like elements are designated by like numerals or signs, and duplicates of explanation are omitted. Furthermore, for reasons of convenience of illustration, the dimensional ratios within the drawings are not always the same as those given in the explanations.

Incidentally, "% by weight" has the same meaning as "% by mass".

Figure 1:
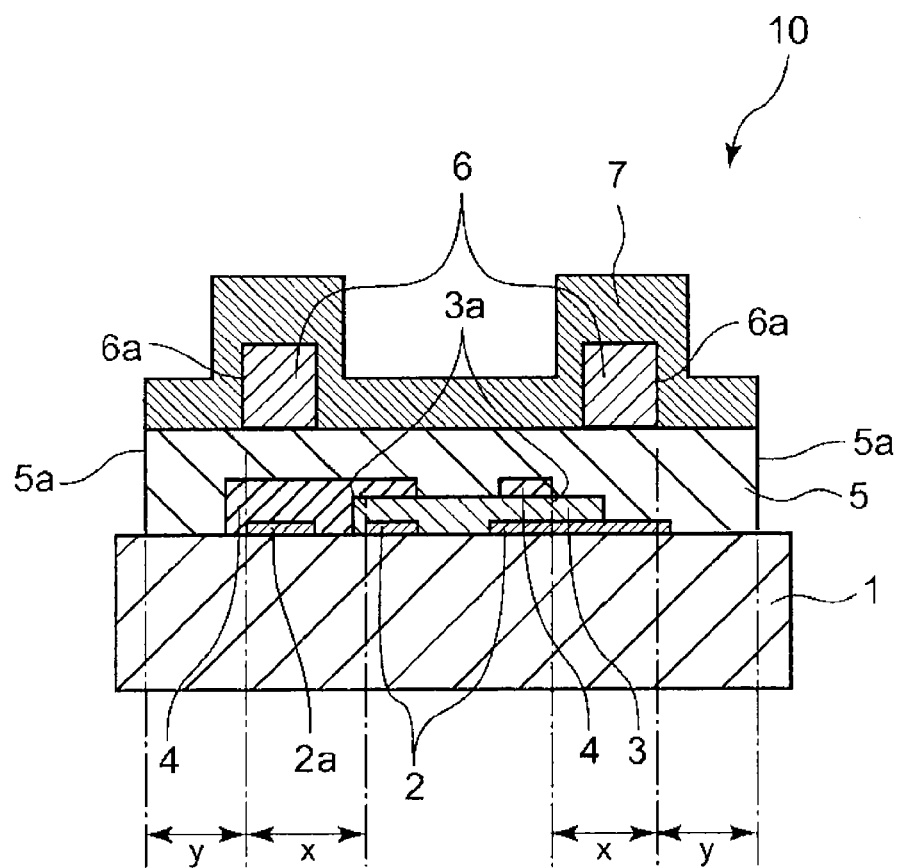
FIG. 1 is a cross-sectional view which illustrates one embodiment of the organic EL light-emitting device according to the invention.

FIG. 1 is a diagrammatic cross-sectional view which illustrates one preferred embodiment of the organic EL light-emitting device of the invention.

The organic EL light-emitting device 10 shown in FIG. 1 is configured of an organic electroluminescence element and a backing member formed on the back thereof. The organic electroluminescence element and the backing member are explained below in detail.

[Organic Electroluminescence Element]

The organic electroluminescence element of the organic EL light-emitting device 10 includes a translucent substrate 1, a first electrode 2 formed on the translucent substrate 1, an organic functional layer 3 formed on the first electrode 2, and a second electrode 4 formed on the organic functional layer 3. The light emitted by the luminescent layer of the organic functional layer 3 of the organic electroluminescence element is led out through the translucent substrate 1.

The configuration of the organic electroluminescence element and constituent materials therefor can be conventionally known ones. Examples of the constituent materials include the following.

(Substrate)

The translucent substrate 1 serves as the support of the organic electroluminescence element, and use can be made of a quartz or glass plate, a metal plate, a metal foil, a plastic film or sheet, etc. Especially preferred is a glass plate or a plate of a transparent synthetic resin such as a polyester, polymethacrylate, polycarbonate, or polysulfone.

In the case of using a substrate made of a synthetic resin, it is necessary to take account of gas barrier properties. In case where the translucent substrate 1 has too low gas barrier properties, this organic electroluminescence element may deteriorate due to the outside air which has permeated the translucent substrate 1. Consequently, one of preferred methods is to dispose a dense film of silicon oxide or the like on at least one surface of the synthetic-resin substrate to ensure gas barrier properties.

The thickness of the translucent substrate 1 is usually 0.01-10 mm, preferably 0.1-1 mm.

(First Electrode)

The first electrode 2 is an anode and serves to inject holes into the organic functional layer 3. Usually, this anode is constituted of a metal such as aluminum, gold, silver, nickel, palladium, or platinum, a metal oxide such as an oxide of indium and/or tin, a metal halide such as copper iodide, or carbon black, or constituted of an electrically conductive polymer, such as poly(3-methylthiophene), polypyrrole, or polyaniline, or the like.

The thickness of the anode differs depending on required transparency. In the case where transparency is required, it is desirable to adjust the visible light transmittance to usually 60% or higher, preferably 80% or higher. In this case, the thickness of the anode is usually 5 nm or larger, preferably 10 nm or larger, and the upper limit thereof is usually 1,000 nm, preferably 500 nm. In the case where the anode may be opaque, this anode may have any desired thickness and may be identical with the translucent substrate 1. Although the first electrode 2 usually has a single-layer structure, it is also possible, according to need, to configure the first electrode 2 so as to have a structure composed of superposed layers constituted of a plurality of materials.

(Organic Functional Layer)

The organic functional layer 3 may have either a single-layer structure or a multilayer structure, so long as the layer 3 at least includes a luminescent layer. Examples of the multilayer structure include a three-layer structure composed of a hole injection/transport layer, a luminescent layer, and an electron injection layer and a five-layer structure composed of a hole injection layer, a hole transport layer, a luminescent layer, a hole blocking layer, and an electron injection layer. A desired structure can be suitably selected.

Examples of hole transport materials include porphyrin compounds, phthalocyanine compounds, quinacridone compounds, indanthrene compounds, and aromatic amine compounds. Preferred of these are aromatic amine compounds. Especially preferred from the standpoint of the heat resistance of the organic electroluminescence element are 4,4'-bis[N-(2-naphthyl)-N-phenylamino]biphenyl (α-NPD), which is represented by the following formula (1), 4,4'-bis[N-(9-phenanthryl)-N-phenylamino]biphenyl (PPD), which is represented by the following formula (2), spiro-NPB, which is represented by the following formula (3), spino-TAD, which is represented by the following formula (4), and 2-TNATA, which is represented by the following formula (5).

[Chem. 1]

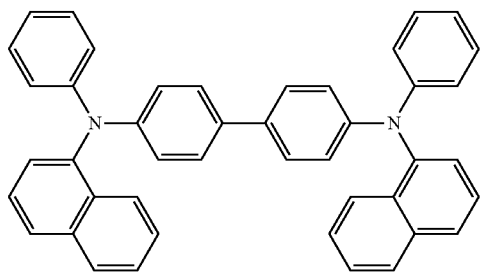
(1)

[Chem. 2]

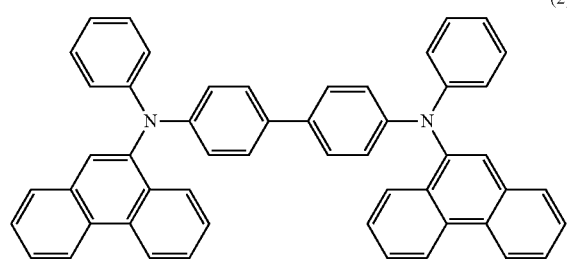
(2)

[Chem. 3]

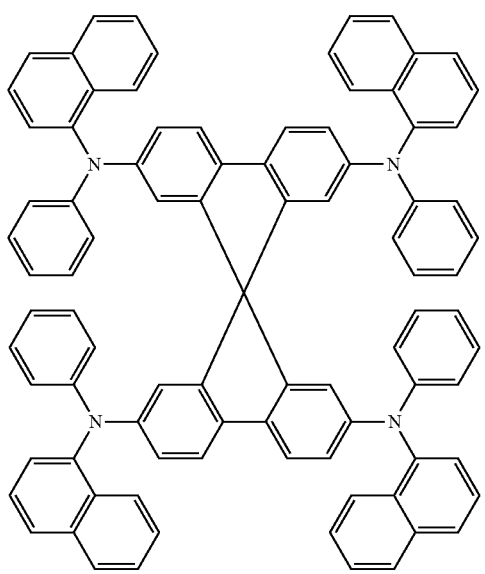
(3)

[Chem. 4]

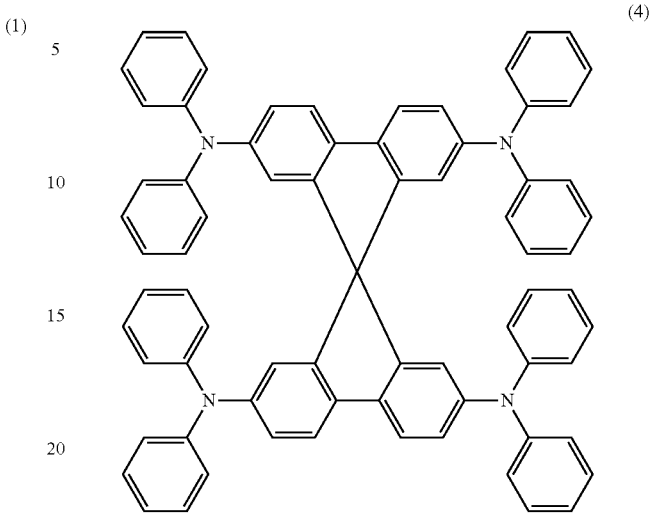
(4)

[Chem. 5]

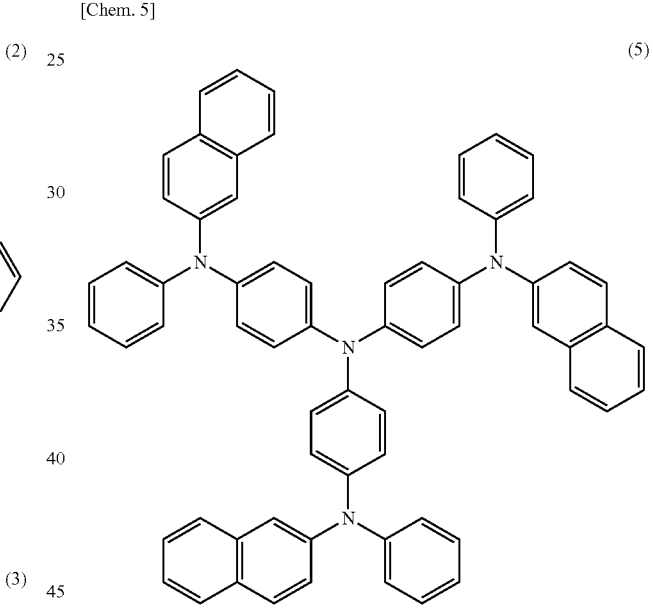
(5)

Examples of electron transport materials include oxadiazole derivatives, oxazole derivatives, thiazole derivatives, thiadiazole derivatives, pyrazine derivatives, triazole derivatives, triazine derivatives, perylene derivatives, quinoline derivatives, quinoxaline derivatives, fluorenone derivatives, anthrone derivatives, phenanthroline derivatives, organometallic complexes, pyridine derivatives, pyrrolopyridine derivatives, pyrimidine derivatives, naphthyridine derivatives, and silole derivatives.

It is possible to suitably select charge transport materials from the hole transport materials and electron transport materials shown above and from other materials and to use the selected materials, unless the use thereof defeats the object of the invention. It is a matter of course that other materials can be used.

Examples of luminescent materials include low-molecular-weight materials such as 9,10-diarylanthracene derivatives, pyrene, coronene, perylene, rubrene, 1,1,4,4-tetraphenylbutadiene, tris(8-quinolinolato)aluminum complex, tris(4-methyl-8-quinolinolato)aluminum complex, bis(8-quinolinolato)zinc complex, tris(4-methyl-5- trifluoromethyl-8-quinolinolato)aluminum complex, tris(4-methyl-5-cyano-8-quinolinolato)aluminum complex, bis(2-methyl-5-trifluoromethyl-8-quinolinolato) [4-(4-cyanophenyl)phenolato]aluminum complex, bis(2-methyl-5-cyano-8-quinolinolato) [4-(4-cyanophenyl)phenolato] aluminum complex, tris(8-quinolinolato)scandium complex, bis[8-(para-tosyl)aminoquinoline]zinc complex and -cadmium complex, 1,2,3,4-tetraphenylcyclopentadiene, pentaphenylcyclopentadiene, poly(2,5-diheptyloxy-para-phenylenevinylene), coumarin-based fluorescent substances, perylene-based fluorescent substances, pyrane-based fluorescent substances, anthrone-based fluorescent substances, porphyrin-based fluorescent substances, quinacridone-based fluorescent substances, N,N'-dialkyl-substituted quinacridone-based fluorescent substances, naphthalimide-based fluorescent substances, and N,N'-diaryl-substituted pyrrolopyrrole-based fluorescent substances and high-molecular-weight materials such as polyfluorene, poly(para-phenylenevinylene), and polythiophene.

The thickness of the organic functional layer 3 varies depending on whether the layer 3 has a single-layer structure or a multilayer structure. However, the thickness thereof is usually 1,000 nm or less, and is preferably 50-150 nm from the standpoint of thickness reduction.

A hole blocking layer, an electron transport layer, etc. may be formed from suitably selected materials on the luminescent layer so long as the formation of these layers does not defeat the object of the invention.

(Second Electrode)

The second electrode 4 is a cathode and serves to inject electrons into the organic functional layer 3. As this cathode, use can be made of the same materials usable as the anode. However, from the standpoint of efficiently injecting electrons, metals having a low work function are preferred. For example, use may be made of adequate metals such as tin, magnesium, indium, calcium, aluminum, and silver or alloys thereof. Specific examples thereof include alloy electrodes having a low work function, such as magnesium-silver alloys, magnesium-indium alloys, and aluminum-lithium alloys. One material for the cathode may be used alone, or two or more metals therefor may be used in combination in any desired proportion.

The thickness of the cathode is usually the same as that of the anode.

[Backing Member]

Meanwhile, the backing member of the organic EL light-emitting device 10 includes a sealing layer 5, a hygroscopic layer 6, and a protective layer 7. A sealing layer 5 is a layer formed so as to cover an exposed upper surface of the translucent substrate 1 of an organic electroluminescence element. The sealing layer 5 according to this embodiment has been formed so as to cover both part of the main surface of the translucent substrate 1 and the surfaces of the anode 2, organic functional layer 3, and cathode layer 4 while being in direct contact therewith. The protective layer 7 has been formed over the sealing layer 5 so as to cover the sealing layer 5, and the hygroscopic layer 6 has been formed between the sealing layer 5 and the protective layer 7 so as to be in contact with the protective layer 7. The hygroscopic layer 6 according to this embodiment has been formed in the shape of an open square so that the hygroscopic layer 6 surrounds at least the luminescent region of the luminescent layer constituting the organic functional layer 3, along the outer periphery of the luminescent region while maintaining a given distance therefrom.

In the backing member, the dimension of the edge 6a of the hygroscopic layer 6 is longer along horizontal directions than the dimension of the luminescent-region edge 3a of the luminescent layer constituting the organic functional layer 3, and is shorter than the dimension of the edge 5a of the sealing layer 5 along the horizontal directions. Namely, the edge 6a of the hygroscopic layer 6 protrudes along horizontal directions from the luminescent-region edge 3a of the luminescent layer of the organic functional layer 3, and the edge 5a of the sealing layer 5 protrudes along horizontal directions from the edge 6a of the hygroscopic layer 6.

In this description, the term "edge" means the portions which are most protrudent outward in the organic electroluminescence light-emitting device along horizontal directions, while the term "horizontal directions" means directions which are parallel with the main surfaces of the translucent substrate 1. The term "luminescent region of the luminescent layer" in this description means that region of the luminescent layer constituting the organic functional layer 3 which luminesces when a voltage is applied between the electrodes, i.e., the region in which the first electrode 2, the organic functional layer 3, and the second electrode 4 overlap and from which the light produced by the element is emitted outward. The term "luminescent-region edge 3a of the luminescent layer" means the outermost edge of the luminescent layer located in the region in which the first electrode 2, the organic functional layer 3, and the second electrode 4 overlap.

The horizontal distance x from the luminescent-region edge 3a of the luminescent layer to the edge 6a of the hygroscopic layer 6 is usually 0.4 mm or longer, preferably 1 mm or longer, more preferably 10 mm or longer. The upper limit thereof is usually 100 mm, preferably 50 mm, more preferably 10 mm.

By regulating x to 0.4 mm or longer, the moisture which has penetrated through the edge of the backing member can be efficiently absorbed by the hygroscopic layer to inhibit the luminescent layer from deteriorating.

The present inventors made investigations on member configurations whereby water molecules that have penetrated into the sealing layer through the edge of the backing member are efficiently led to the hygroscopic layer. As a result, the inventors have reached a conclusion that in the case where the water molecules in the sealing layer are located at such a position that the horizontal-direction position thereof with respect to the substrate is at the edge of the hygroscopic layer and the vertical-direction position thereof with respect to the substrate is any position, then the probability that the water molecules reach the hygroscopic layer during the period when the water molecules move over a distance of x is higher if the thickness of the sealing layer is equal to or smaller than x. Since the thickness of the sealing layer is usually 200 μm or less as will be stated later, it is thought that a sufficient effect is produced so long as x is at least two times the thickness of the sealing layer. Consequently, it is presumed that x is 0.4 mm or larger.

Meanwhile, the horizontal distance y from the edge 6a of the hygroscopic layer 6 to the edge 5a of the sealing layer 5 is usually 0.1 mm or larger, preferably 1 mm or larger. The upper limit thereof is usually 10 mm, preferably 5 mm.

As described above, since the backing member employed in the organic EL light-emitting device 10 is a seal formed by successively superposing a sealing layer 5, a hygroscopic layer 6, and a protective layer 7 so that the edge 6a of the hygroscopic layer 6 is disposed at the given position, this backing member not only can block external moisture but also is excellent in terms of the property of dissipating the heat generated by the luminescent layer. Consequently, the organic electroluminescence element is inhibited from deteriorating and can retain stable luminescent properties for a long period.

In addition, since the protective layer 7 is constituted of a flexible material, not only the organic EL light-emitting device 10 can be made to have a smaller weight and a smaller thickness than conventional organic EL light-emitting devices but also a reduction in cost can be attained. Furthermore, since the sealing layer 5 includes a thermoplastic resin, it is possible to melt the thermoplastic resin of the sealing layer and recycle the substrate in case where the organic electroluminescence element has deteriorated.

(Sealing Layer)

The thermoplastic resin contained in the sealing layer 5 is not particularly limited. Examples thereof include polypropylene, polyethylene, polystyrene, polyisobutylene, polyesters, and polyisoprene. These resins can be used alone or in combination of two or more thereof. Preferred of these from the standpoint of low hygroscopicity are polypropylene, polyethylene, and polyisobutylene. The glass transition temperature of the thermoplastic resin is usually −80° C. or higher, preferably −20° C. or higher, from the standpoint of heat resistance, and there is no particular upper limit thereon.

The sealing layer 5 may contain ingredients other than those thermoplastic resins. Examples thereof include petroleum resins and cycloolefin-based polymers.

Examples of the petroleum resins include the C5 petroleum resins, C9 petroleum resins, and C5/C9 copolymer petroleum resins which are shown in "14906 No Kagaku Shōhin" (published by The Chemical Daily Co., Ltd.), p. 1192.

Examples of the cycloolefin-based polymers include hydrogenated terpene resins (e.g., Clearon P, M, and K Series), hydrogenated rosin and hydrogenated rosin ester resins (e.g., Foral A X, Foral 1105, Pensel A, Ester Gum H, and Super Ester A Series), disproportionated rosin and disproportionated rosin ester resins (e.g., Pinecrystal Series), hydrogenated dicyclopentadiene-based resins which are resins produced by hydrogenating C5 petroleum resins obtained by copolymerizing a C5 fraction including pentene, isoprene, perylene, and 1,3-pentadiene and yielded by the thermal cracking of petroleum naphtha (e.g., Escorez 5300 and 5400 Series and Eastotac H Series), resins produced by hydrogenating C9 petroleum resins obtained by copolymerizing a C9 fraction including indene, vinyltoluene, and α- or β-methylstyrene and yielded by the thermal cracking of petroleum naphtha (e.g., Arkon P or M Series), and resins produced by hydrogenating petroleum resins obtained by copolymerizing the C5 fraction and the C9 fraction (e.g., I-Mary Series).

Ingredients such as, for example, a filler, ultraviolet absorber, ultraviolet stabilizer, antioxidant, and resin stabilizer may have been further added suitably to the thermoplastic resin so long as the addition thereof does not lessen the pressure-sensitive adhesive properties, etc.

With respect to the thickness of the sealing layer 5, the lower limit thereof is usually 1 μm or larger, preferably 10 μm or larger, and the upper limit thereof is usually 200 μm or less, preferably 150 μm or less, more preferably 100 μm or less.

(Hygroscopic Layer)

Although the hygroscopic layer 6 contains a desiccant, this desiccant is not particularly limited so long as the desiccant has high hygroscopicity. Examples thereof include alkaline earth metals, alkali metals, oxides thereof, or inorganic porous materials. These desiccants can be used alone or in combination of two or more thereof. Preferred of these, from the standpoints of hygroscopicity and safety in handling, are oxides of either alkaline earth metals or alkali metals and inorganic porous materials. Especially preferred are calcium oxide and zeolites.

The hygroscopic layer 6 may contain ingredients other than desiccants. Examples thereof include highly thermally conductive particles, rods, or the like constituted of Si, AlN, or C.

With respect to the shape of the hygroscopic layer 6, FIG. 1 shows an open square shape. However, the shape thereof is not particularly limited so long as the layer 6 can absorb the moisture which has permeated from outside. A shape such as a square shape, rectangular shape, circular shape, elliptic shape, or the like can be suitably selected in accordance with the luminescent region of the luminescent layer. The hygroscopic layer 6 may have either an open structure or a planar structure so long as the structure can block external moisture.

With respect to the thickness of the hygroscopic layer 6, the lower limit thereof is usually 0.1 μm or larger, preferably 1 μm or larger, more preferably 10 μm or larger. The upper limit thereof is usually 500 μm or less, preferably 200 μm or less, more preferably 100 μm or less.

(Protective Layer)

The protective layer 7 not only blocks external moisture and oxygen but also functions also as a support when the backing member is produced. The protective layer 7 has flexibility.

As the protective layer 7, use can be usually made of for example, a metal foil or a layered structure composed of a plastic film and an inorganic-compound layer. It is preferred that the protective layer 7 should have gas barrier properties. Examples of metals having gas barrier properties include aluminum, copper, nickel, and alloy materials such as stainless steel and aluminum alloys. Examples of the layered structure composed of a plastic film and an inorganic-compound layer include multilayer films obtained by superposing one or more layers of an inorganic oxide, e.g., silicon oxide or aluminum oxide, or of an inorganic nitride, e.g., silicon nitride or aluminum nitride, on a plastic film. Preferred of these are metal foils. Especially preferred are aluminum foils. Use of a metal foil is preferred not only from the standpoints of processing and cost reduction but also because metal foils are excellent in terms of the property of blocking external moisture or oxygen, are easy to bend according to need, and are less apt to develop defects, such as pinholes or cracks, when the metal foils are heated or stress is imposed thereon. In particular, aluminum foils are preferred because the foils have a most balanced combination of processability and durability.

With respect to the thickness of the protective layer 7, the lower limit thereof is usually 1 μm or larger, preferably 10 μm or larger. The upper limit thereof is usually 500 μm or less, preferably 200 μm or less.

The thickness relationship between the protective layer 7 and the sealing layer 5 in the luminescent region is preferably such that the thickness α of the protective layer 7 is at least 0.3 times the thickness β of the sealing layer 5. It is thought that by regulating the thickness of the protective layer 7 so as to be at least 0.3 times the thickness of the sealing layer 5, the heat generated in the organic electroluminescence element can be efficiently transmitted to the protective layer 7 through the sealing layer 5 and be efficiently dissipated from the protective layer 7.

The reasons therefor are thought to be as follows. One of the deteriorations of organic electroluminescence elements caused by the operation thereof is a deterioration due to heat generation during the operation. For suppressing the influences of heat generation, it is necessary to efficiently dissipate the heat generated in the organic electroluminescence element. The dissipation of heat is thought to be enhanced by efficiently transmitting the heat to the protective layer 7, which is the outermost layer of the backing member, and by making the protective layer 7 easily receive the heat. For efficiently transmitting the heat from the organic electroluminescence element, it is necessary to reduce the "thermal resistance per unit area" of the sealing layer 5. For making the protective layer 7 easily receive the heat, it is necessary to increase the "heat capacity per unit area" of the protective layer 7. The "thermal resistance per unit area" of the sealing layer 5 is proportional to the thickness of the sealing layer 5, while the "heat capacity per unit area" of the protective layer 7 is proportional to the thickness of the protective layer 7. The lower the "thermal resistance per unit area" of the sealing layer 5, the higher the thermal conductivity; while the higher the "heat capacity per unit area" of the protective layer 7, the more the protective layer 7 is apt to store heat therein. It is hence thought that the heat generated in the organic electroluminescence element is easily transferred efficiently to the protective layer 7 and stored in the protective layer 7, thereby inhibiting the organic electroluminescence element from increasing in temperature and from deteriorating during operation.

The present inventors diligently made investigations and, as a result, have found that in the case where the thickness of the protective layer 7 is at least 0.3 times the thickness of the sealing layer 5, elements having a long service life can be obtained as will be demonstrated by Examples given later.

The thickness of the organic EL light-emitting device 10 is usually 0.1-5 mm, preferably 0.5-3 mm, more preferably 1-2 mm.

Figure 2:
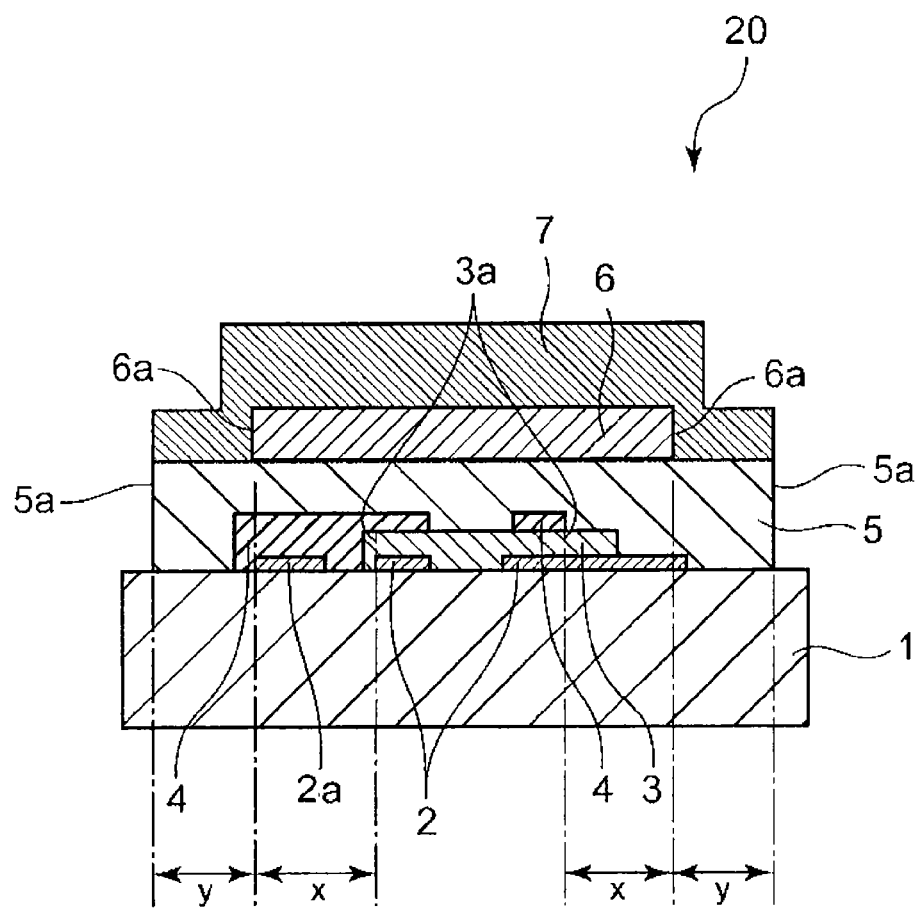
FIG. 2 is a cross-sectional view which illustrates another embodiment of the organic EL light-emitting device according to the invention.

Although the invention has been described in detail with reference to an embodiment thereof, the invention should not be construed as being limited to the embodiment. The invention can be variously modified so long as the modifications do not depart from the spirit of the invention. For example, although an organic electroluminescence element obtained by successively superposing an anode 2, an organic functional layer 3, and a cathode 4 on a translucent substrate 1 was explained in the embodiment, it is also possible to employ an organic electroluminescence element obtained by successively superposing a cathode 4, an organic functional layer 3, and an anode 2 on a translucent substrate 1. Furthermore, a hygroscopic layer 6 having the shape of an open square was explained in the embodiment shown in FIG. 1, the hygroscopic layer 6 can be configured so as to have a plane shape which covers the whole luminescent region of the luminescent layer while retaining a given distance (e.g., distance x) from the outer periphery of the luminescent region of the luminescent layer, as shown in FIG. 2. Incidentally, the configuration of the organic EL light-emitting device shown in FIG. 2 is the same as the configuration of the organic EL light-emitting device shown in FIG. 1, except for the shape of the hygroscopic layer 6.

Next, a process for producing an organic EL light-emitting device of the invention is explained.

This process for producing an organic EL light-emitting device of the invention includes an element formation step, a backing member formation step, and a heat treatment step. Each step is explained below.

(Element Formation Step)

Figure 3:
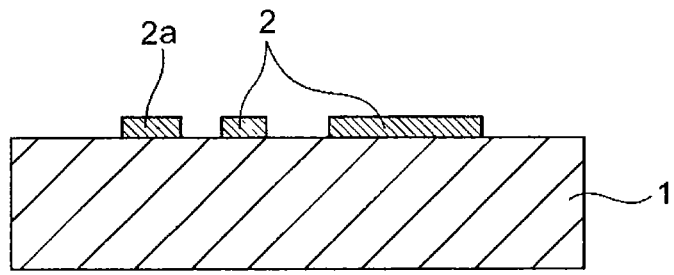
FIG. 3 is cross-sectional views which illustrate one embodiment of production steps according to the invention for producing an organic EL light-emitting device.
Figure 3:
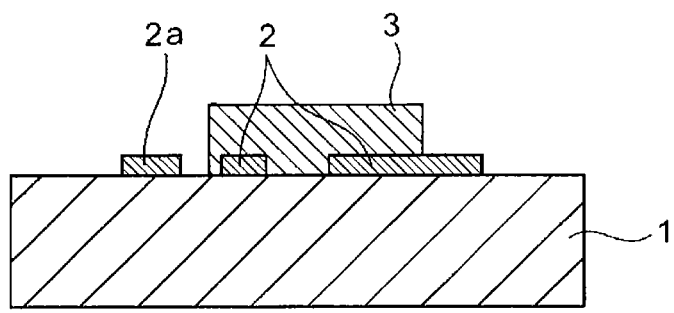
Figure 3:
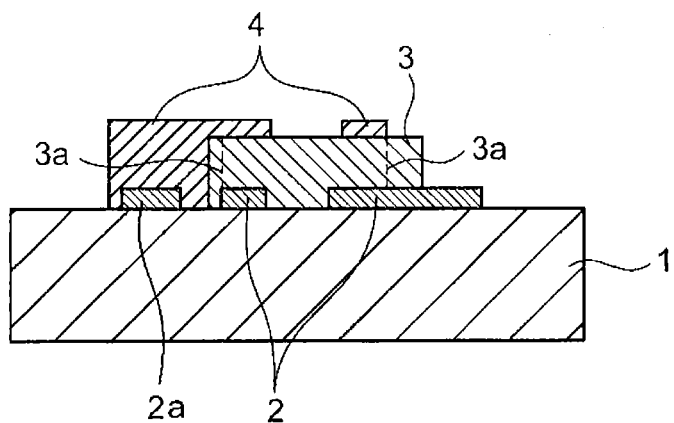

The element formation step is a step in which an organic electroluminescence element is formed, and known methods can be employed. For example, this step can be conducted by the following method. FIG. 3 (a) to (c) are diagrammatic cross-sectional views which illustrate steps for producing the organic electroluminescence element of an organic EL light-emitting device. A method for producing the organic electroluminescence element is explained with reference to FIG. 3 (a) to (c).

First, a translucent substrate 1 is prepared. Next, a first electrode 2 is formed on a surface of the translucent substrate 1 as shown in FIG. 3 (a).

The first electrode 2 can be formed usually by sputtering, vacuum deposition, or the like. In the case where fine particles of a metal, e.g., silver, fine particles of copper iodide or the like, carbon black, fine particles of an electrically conductive metal oxide, fine particles of an electrically conductive polymer, or the like is used to form a first electrode 2, use may be made of a method in which such fine particles are dispersed in an appropriate binder resin solution and this dispersion is applied to the translucent substrate 1, thereby forming a first electrode 2. In the case of an electrically conductive polymer, it is possible to form a first electrode 2 by directly forming a thin film on the translucent substrate 1 by electrolytic polymerization or by applying the electrically conductive polymer on the translucent substrate 1 (*Appl. Phys. Lett.*, Vol. 60, p. 2711, 1992).

Next, an organic functional layer 3 including at least a luminescent layer is formed on the first electrode 2 as shown in FIG. 3 (b).

Methods for forming the organic functional layer 3 can be suitably selected in accordance with the materials therefor. For example, use can be made of vacuum deposition, spin coating, dip coating, die coating, bar coating, blade coating, roll coating, spray coating, capillary coating, ink-jet printing, screen printing, gravure printing, flexographic printing, or the like.

Subsequently, a second electrode 4 is formed on the organic functional layer 3 as shown in FIG. 3 (c).

As a method for forming the second electrode 4, use can be made of sputtering, vacuum deposition, or the like.

(Backing Member Formation Step)

Figure 4:
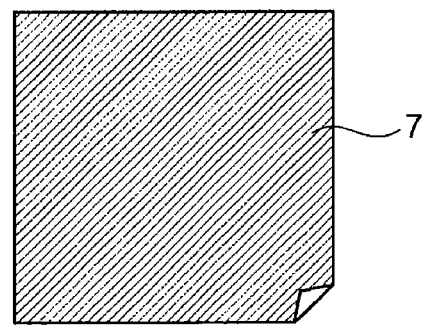
FIG. 4 is plan views illustrating one embodiment of production steps according to the invention for producing an organic EL light-emitting device.
Figure 4:
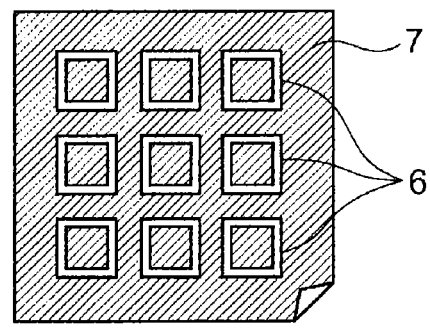
Figure 4:
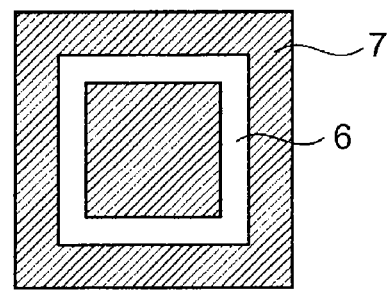
Figure 4:
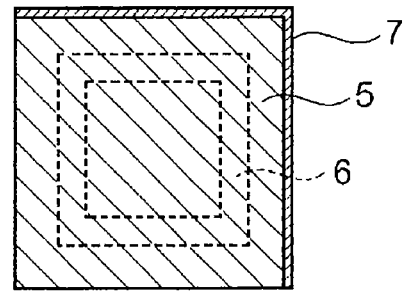

FIG. 4 (a) to (d) are diagrammatic cross-sectional views which illustrate steps for producing the backing member of an organic EL light-emitting device. A method for producing the backing member is explained with reference to FIG. 4 (a) to (d).

First, a flexible sheet such as that shown in FIG. 4 (a), which serves as a protective layer 7, is prepared.

Next, as shown in FIG. 4 (b), a hygroscopic layer 6 is formed in the shape of open squares on a surface of the protective layer 7 so that the hygroscopic layer 6 surrounds each luminescent region of the luminescent layer along the outer periphery of the luminescent region while maintaining a given distance therefrom.

Methods for forming the hygroscopic layer 6 can be suitably selected in accordance with the materials therefor. For example, use can be made of a dry film formation method such as vacuum deposition, insertion of a sheet-form hygroscopic sheet, a wet film formation method such as spin coating, dip coating, die coating, bar coating, blade coating, roll coating, spray coating, capillary coating, ink-jet printing, screen printing, gravure printing, flexographic printing, or coating fluid application with a dispenser, or the like. Of these, wet film formation methods are preferred from the standpoints of the degree of freedom of printed patterns and cost reduction. More preferred are die coating, spray coating, and printing techniques such as screen printing, gravure printing, flexographic printing, and coating fluid application with a dispenser. It is especially preferred to employ screen printing or coating fluid application with a dispenser.

Subsequently, the protective layer 7 on which the hygroscopic layer 6 has been formed in a matrix arrangement as shown in FIG. 4 (b) is cut into pieces along the outer peripheries of the hygroscopic layer 6 while maintaining a given distance therefrom, as shown in FIG. 4 (c). This cutting may be conducted after the subsequent step of forming a sealing layer.

Next, as shown in FIG. 4 (d), a sealing layer 5 including a thermoplastic resin is formed on the hygroscopic layer 6. In this case, the sealing layer 5 is formed so that the surface of the hygroscopic layer 6 is wholly covered with the sealing layer 5 and that the edge 5a of the sealing layer 5 protrudes from the edge 6a of the hygroscopic layer 6.

For forming the sealing layer 5, use may be made of a method such as a coating or printing technique, e.g., roll coating, spin coating, screen printing, or spray coating. From the standpoint of operation efficiency, however, it is preferred to employ a method in which a thermoplastic pressure-sensitive adhesive in a sheet form is applied.

Figure 5:
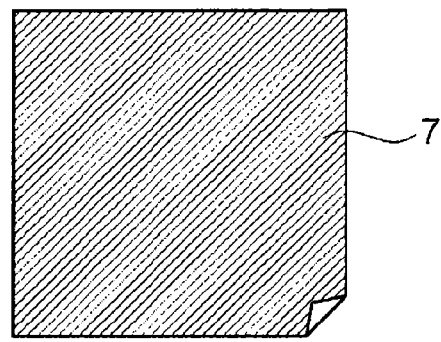
FIG. 5 is plan views illustrating another embodiment of production steps according to the invention for producing an organic EL light-emitting device.
Figure 5:
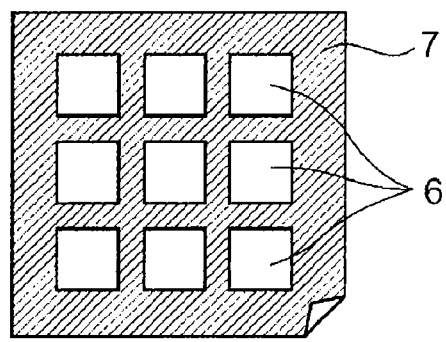
Figure 5:
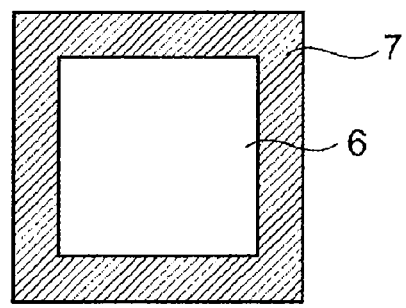
Figure 5:
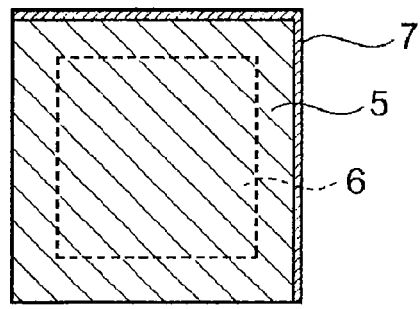
Figure 6:
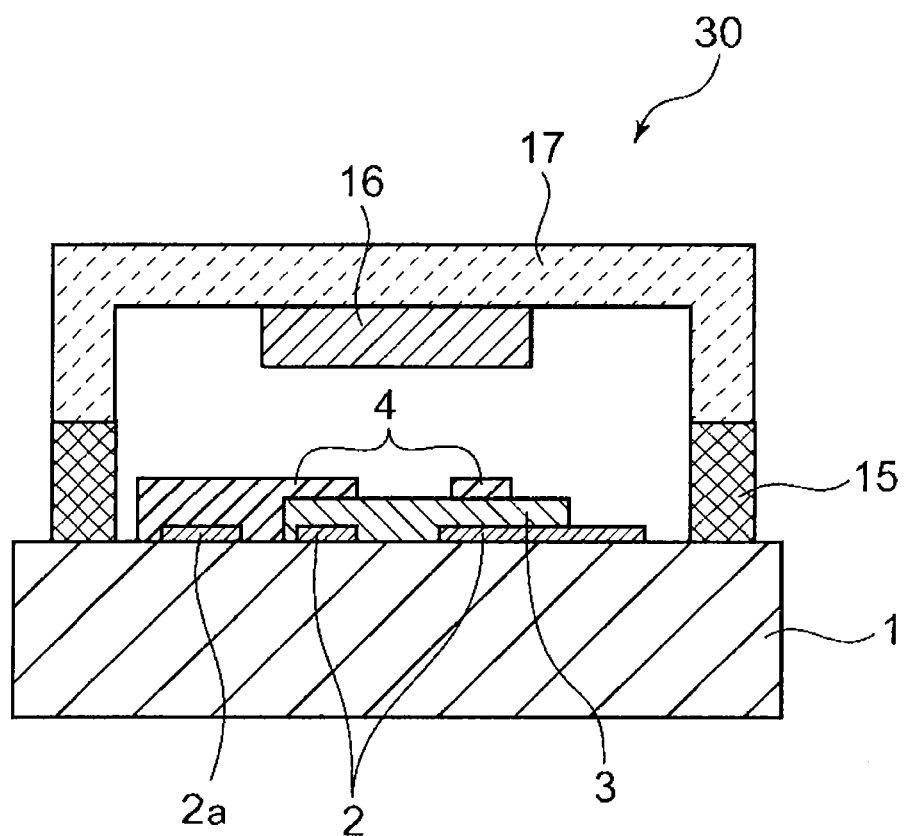
FIG. 6 is a cross-sectional view which illustrates one example of conventional organic EL light-emitting devices.

In place of the method shown in FIG. 4, the method shown in FIG. 5 can be used to produce the backing member of an organic EL light-emitting device. FIG. 5 (a) to (d) are diagrammatic cross-sectional views which illustrate other steps for producing the backing member of an organic EL light-emitting device. This method for producing a backing member is explained with reference to FIG. 5 (a) to (d).

A flexible sheet such as that shown in FIG. 5 (a), which serves as a protective layer 7, is prepared. As shown in FIG. 5 (b), a hygroscopic layer 6 is formed in the shape of planes on a surface of the flexible sheet, which serves as a protective layer 7, so that each plane shape covers the whole luminescent region of the luminescent layer while maintaining a given distance from the outer periphery of the luminescent region of the luminescent layer. Incidentally, methods usable for forming the hygroscopic layer 6 are as explained above.

Next, the protective layer 7 is cut into pieces along the outer peripheries of the hygroscopic layer 6 while maintaining a given distance therefrom, as shown in FIG. 5 (c). Thereafter, a sealing layer 5 including a thermoplastic resin is formed on the hygroscopic layer 6 as shown in FIG. 5 (d). The cutting may be conducted after the subsequent step of forming a sealing layer 5. It is also possible to employ a sheet-by-sheet step in which a hygroscopic layer 6 is formed on a flexible sheet that serves as a protective layer 7 and that has been cut into a given size. Next, a sealing layer 5 including a thermoplastic resin is formed on the hygroscopic layer 6. This sealing layer 5 is formed in the same manner as that shown above with reference to FIG. 4 (d).

It is preferred that the flexible sheet serving as a protective layer 7 should be subjected beforehand to processing in which the regions thereof on which a hygroscopic layer 6 is to be formed are each formed into a recessed shape. Alternatively, it is preferred that after the formation of a hygroscopic layer 6, the protective layer 7 should be formed into a shape including recesses in accordance with the shape of the hygroscopic layer 6. It is preferred that the depth of each recess should be substantially the same as the thickness of the hygroscopic layer 6. The reason for this is as follows. Since the surface on which a sealing layer 5 is to be formed is a flat surface where the surface of the hygroscopic layer 6 is flush with the surface of the flexible sheet serving as a protective layer 7, the sealing layer 5 can be evenly formed. Consequently, when an element is sealed with the backing member, the sealing layer 5 comes into satisfactory close contact with the element. External penetration of moisture or oxygen is hence prevented.

It is preferred that the hygroscopic layer 6 should have been formed in a plane shape, such as that shown in FIG. 5, which covers the whole luminescent region of the luminescent layer while maintaining a given distance from the outer periphery of the luminescent region of the luminescent layer. The reason for this is that even when minute defects have occurred for some reason in the protective layer 7 located over the luminescent region, the hygroscopic layer blocks moisture to prevent the element from deteriorating. In the case where the flexible sheet serving as a protective layer 7 is subjected beforehand to processing in which the regions thereof on which a hygroscopic layer 6 is to be formed are each formed into a recessed shape or where the formation of a hygroscopic layer 6 is followed by the forming of the protective layer 7 into a shape including recesses in accordance with the shape of the hygroscopic layer 6, these methods are preferred because the shape into which the flexible sheet serving as a protective layer 7 is formed is not complicated, no excessive stress is imposed on the flexible sheet and, hence, defects such as pinholes or cracks are less apt to occur.

Figure 7:
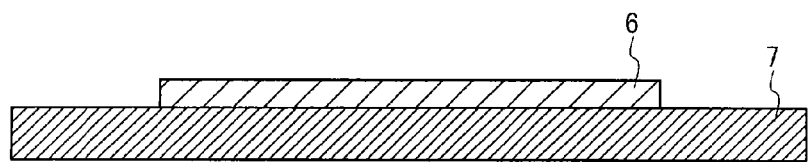
FIG. 7 is views which illustrate a method for forming a protective layer 7 into a recessed shape in accordance with the shape of a hygroscopic layer 6.
Figure 7:
Figure 7:
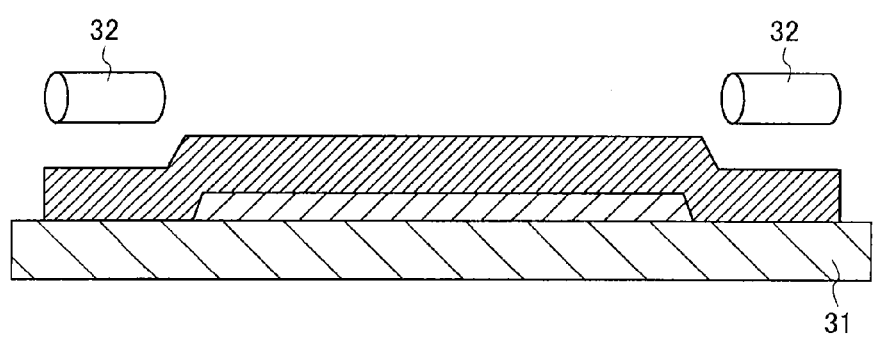
Figure 7:
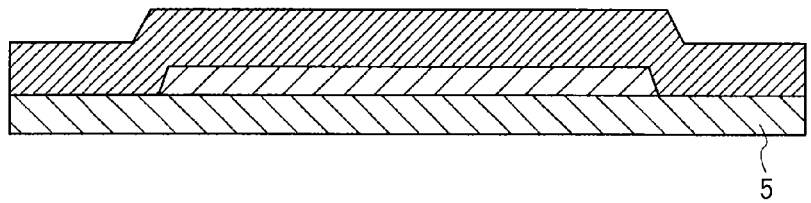

One example of methods for forming, after the formation of a hygroscopic layer 6, the protective layer 7 into a recessed shape in accordance with the shape of the hygroscopic layer 6 is explained with reference to FIG. 7. FIG. 7 (a) shows a state in which a hygroscopic layer 6 has been formed on a protective layer 7. This structure is placed so that the hygroscopic layer 6 faces downward as shown in FIG. 7 (b). Numeral 31 in FIG. 7 (c) denotes a stage, for which a material that has a flat surface and is rigid can be used. For example, use can be made of a glass, a metal such as stainless steel, a ceramic, or the like. Numeral 32 in FIG. 7 (c) denotes a roller. That portion of the protective layer 7 on which the hygroscopic layer 6 was not disposed is pressed with a roller 32, thereby making the hygroscopic layer 6 and the protective layer 7 have surfaces that are flush with each other in accordance with the flat surface of the stage 31. As a result, it is possible to form a sealing layer 5 on the flat surface where the protective layer 7 and the hygroscopic layer 6 are substantially flush with each other, as shown in FIG. 7 (d). The formation of a sealing layer 5 on the flat surface is preferred, for example, because bubble inclusion is less apt to occur and the sealing layer 5 has no portion which has deformed to be reduced in close contact.

(Heat Treatment Step)

Next, the organic electroluminescence element and the backing member which were obtained by the steps described above are stacked in the following manner. That surface of the organic electroluminescence element on which the electrodes have been formed is placed on that surface of the backing member on which the sealing layer has been formed, so that the edge of the hygroscopic layer protrudes from the luminescent-region edge of the luminescent layer along horizontal directions by 0.4 mm or more. This stack is bonded together.

The heat treatment step is accomplished by heat-treating the organic electroluminescence element and backing member which have been stacked and bonded, while pressing the stack from the organic electroluminescence element side and the backing member side in an ordinary-pressure, reduced-pressure, or high-pressure atmosphere. For the heating, use can be made of a hot laminator, oven, hot plate, or the like. The heating temperature is usually 200° C. or lower, preferably 170° C. or lower. The pressing can be conducted by means of a laminator, a pressing means such as a pressure roller or a pressing machine, a high-pressure atmosphere, or the like.

Bonding in a reduced-pressure atmosphere is preferred because no air inclusion occurs between the organic electroluminescence element and the backing member and, hence, a reduction in water permeability is attained and separation is less apt to occur.

(Hot Pressing)

It is especially preferred that the heat treatment step should include a treatment in which that region of the protective layer 7 which is outside the luminescent-region edge of the luminescent layer and in which the hygroscopic layer 6 is not present is pressed while being heated (hot pressing). The heat treatment step including this treatment is preferred because the sealing layer 5 in the region outside the luminescent-region edge of the luminescent layer comes to have a reduced thickness and the amount of external moisture or oxygen which permeates the sealing layer 5 is reduced. In addition, since the thickness of the sealing layer 5 in the region where the luminescent region and the hygroscopic layer 6 are present is larger than the thickness of the sealing layer 5 in the region which is outside the luminescent-region edge of the luminescent layer and in which the hygroscopic layer 6 is not present, the moisture or oxygen that has externally permeated the sealing layer 5 is diffused in that part of the sealing layer 5 which is located in the region where the luminescent region and the hygroscopic layer 6 are present. As a result, the probability that moisture or oxygen reaches the luminescent layer to deteriorate the luminescent layer can be reduced. This heat treatment step is hence preferred.

Figure 8:
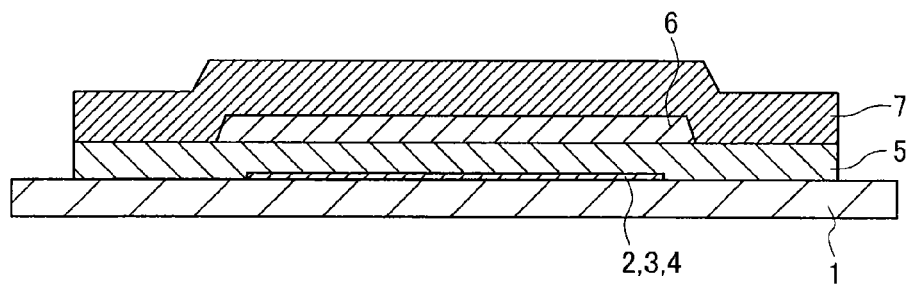
FIG. 8 is views that illustrate a manner in which an organic EL element is sealed with a backing member.
Figure 8:
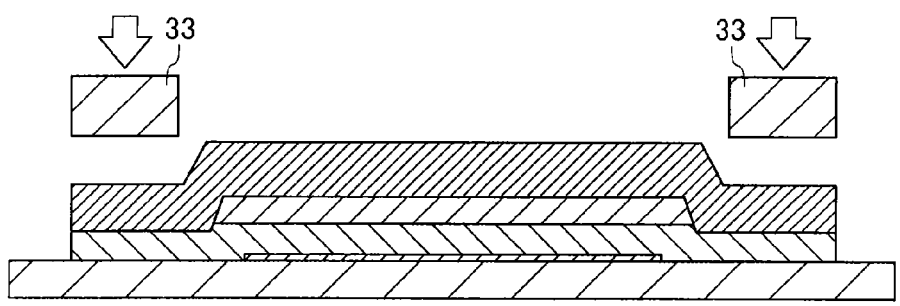
Figure 8:
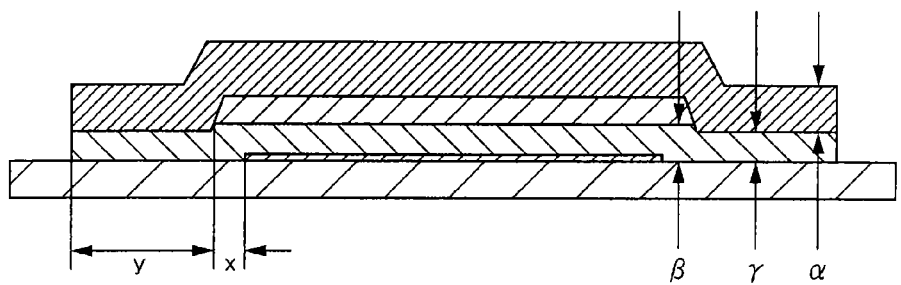

In FIG. 8 is shown one example for sealing an organic electroluminescence element with a backing member. FIG. 8 (a) is a view which shows a state in which a backing member composed of a protective layer 7, a hygroscopic layer 6, and a sealing layer 5 has been superposed on an organic electroluminescence element including a translucent substrate 1, a first electrode 2 formed thereon, an organic functional layer 3 formed on the first electrode 2, and a second electrode 4 formed on the organic functional layer 3. The backing member in this state is in close contact to such a degree that the backing member does not peel off. However, there is a possibility that this backing member might become prone to peel off during long-term use or in a high-temperature high-humidity environment.

It is therefore preferred that the heat treatment step should include the hot pressing shown in FIG. 8 (b). Numeral 33 in FIG. 8 (b) denotes a hot-pressing member, which is part of the members of a pressing apparatus. Although not shown, the translucent substrate has been disposed on a stage. The heating may be conducted by heating the stage or by heating the hot-pressing member 33 or by conducting the hot pressing in a high-temperature environment. Only the region located outside the luminescent-region edge is hot-pressed with the hot-pressing member 33. As a result, an organic EL light-emitting device having satisfactory durability can be obtained in which the backing member is in highly close contact and does not peel off during long-term use or even in a high-temperature high-humidity environment and in which the non-luminescent region is less apt to expand.

The heating temperature in the hot pressing is usually 50° C. or higher, preferably 60° C. or higher, and is usually 200° C. or lower, preferably 170° C. or lower. By conducting the hot pressing at a temperature within this range, the organic functional layer 3 is prevented from deteriorating thermally and the close contact of the sealing layer 5 with the translucent substrate 1 can be enhanced.

Furthermore, as a result of the hot pressing, the protective layer 7 and the sealing layer 5 are deformed and the sealing layer 5 comes to have a thickness smaller than the initial thickness thereof. In FIG. 8 (c), $\beta$ indicates the initial thickness of the sealing layer 5, and $\gamma$ indicates the thickness of the sealing layer 5 which has undergone the hot pressing. Since $\beta > \gamma$, the moisture which has penetrated through the edge and permeates the sealing layer 5 comes to have a reduced concentration when the moisture reaches that region of the sealing layer 5 where the hygroscopic layer 6 is present or that part of the sealing layer 5 which overlies the luminescent region, because of an increase in cross-sectional area. The organic functional layer 3 hence is less apt to be deteriorated. Consequently, this hot pressing is preferred. Incidentally, since the thickness of that part of the organic electroluminescence element which lies in the luminescent region (sum of 2, 3, and 4) is sufficiently smaller than the thickness of the sealing layer 5 in FIG. 8 (c), the thickness of the sealing layer 5 that overlies the luminescent region is regarded as approximately the same as the thickness $\beta$ of the sealing layer 5 that is located in the region where the hygroscopic layer 6 protrudes from the luminescent-region edge.

The amount of the deformation of the sealing layer 5 due to the hot pressing $((1-\gamma/\beta) \, 100(\%))$ is usually at least 10%, preferably at least 20%, of the thickness of the sealing layer 5, and is usually up to 90%, preferably up to 80%, thereof. This range is preferred because the sealing layer 5 not only comes into sufficiently close contact with the translucent substrate 1 to reduce moisture permeability and to become less apt to peel off, but also does not rupture. Furthermore, that range is preferred because the protective layer 7 is less apt to develop cracks or pinholes.

Thus, the organic EL light-emitting device of the invention can be produced. The organic EL light-emitting device of the invention can be applied as the display parts of personal computers, cell phones, digital still cameras, television receivers, viewfinder type or direct view monitor type video tape recorders, car navigation apparatus, pagers, electronic organizers, electronic calculators, word processors, work stations, videophones, POS terminals, and appliances equipped with a touch panel.

[Organic EL Display Device]

The organic EL display device of the invention is a display device which employs the organic electroluminescence element of the invention described above. There are no particular limitations on the type and structure of the organic EL display device of the invention, and the display device can be assembled using the organic electroluminescence element of the invention in accordance with ordinary methods. For example, the organic EL display device of the invention can be produced by methods such as those described in *Yūki EL Disupurei* (Ohmsha, Ltd., published on Aug. 20, 2004, written by TOKITO Shizuo, ADACHI Chihaya, and MURATA Hideyuki).

[Organic EL Illuminator]

The organic EL illuminator of the invention is an illuminator which employs the organic electroluminescence element of the invention described above. There are no particular limitations on the type and structure of the organic EL illuminator of the invention, and the illuminator can be produced using the organic electroluminescence element of the invention in accordance with ordinary methods.

EXAMPLES

The invention will be explained below in more detail by reference to Examples. However, the invention should not be construed as being limited to the following Examples, and the invention can be modified at will unless the modifications depart from the spirit of the invention.

Example 1

The organic EL light-emitting device shown in FIG. 1 was produced by the following method.

First, an organic electroluminescence element having a 2-mm-square luminescent region was produced in the manner shown in FIG. 3.

<Formation of Hole Injection Layer on ITO Substrate>

As an ITO substrate 1, use was made of a substrate constituted of a glass substrate 1 having a length of 3.75 cm, width of 2.5 cm, and thickness of 0.7 mm and, formed thereon, a transparent conductive film (anode 2) of indium-tin oxide (ITO) having a thickness of 70 nm.

Subsequently, a polymeric compound having the repeating structure represented by the following formula (6) (PB-1; weight-average molecular weight, 52,000; number-average molecular weight, 32,500) was mixed with 4-isopropyl-4'-methyldiphenyliodonium tetrakis(pentafluorophenyl)borate in a mass ratio of 100:20, and this mixture was dissolved in ethyl benzoate so as to result in a concentration of the mixture of 2.0% by weight, thereby preparing a composition. In the air, this composition was applied to the ITO substrate 1 by spin coating in two stages including 2-second spin coating at a spinner rotation speed of 500 rpm and subsequent 30-second spin coating at a spinner rotation speed of 1,500 rpm. Thereafter, the coating film was heated at 230° C. for 15 minutes to thereby form a hole injection layer having a thickness of 30 nm.

Subsequently, a backing member was produced in the manner shown in FIG. 4.

<Formation of Hygroscopic Layer>

An aluminum foil having a thickness of 40 μm was cut into a 100-mm square. DryPaste-S1 (manufactured by Saes Getters), which included calcium oxide as the main component, was used as a desiccant to form a hygroscopic layer having an open-square shape with a thickness of 60 μm, a line width of 3 mm, and a side dimension of 16 mm on the cut aluminum foil in the air by means of a screen printing machine (HP-300, manufactured by Newlong Seimitsu Kogyo Co., Ltd.). Immediately after the printing, the aluminum foil was transferred to a nitrogen atmosphere and baked on a hot plate at 200° C. for 30 minutes. This aluminum foil was cut into a 23-mm square so that the hygroscopic layer of an open-square shape was located at the center.

<Formation of Sealing Layer>

A pressure-sensitive adhesive (JTY-0806; manufactured by 3M) in the form of a 25 μm-thick thermoplastic sheet sandwiched between two PET films was cut into 23-mm squares. Thereafter, the PET film on one side was peeled off, and three sheets (75 μm) of the pressure-sensitive adhesive in a thermoplastic-sheet form were stacked and applied to the aluminum foil so that the resultant sealing layer covered the whole surface of the hygroscopic layer and that the edge of the sealing layer protruded from the edge of the hygroscopic layer by 3.5 mm along horizontal directions, thereby forming a sealing layer. In order to obtain close contact while avoiding

[Chem. 6]

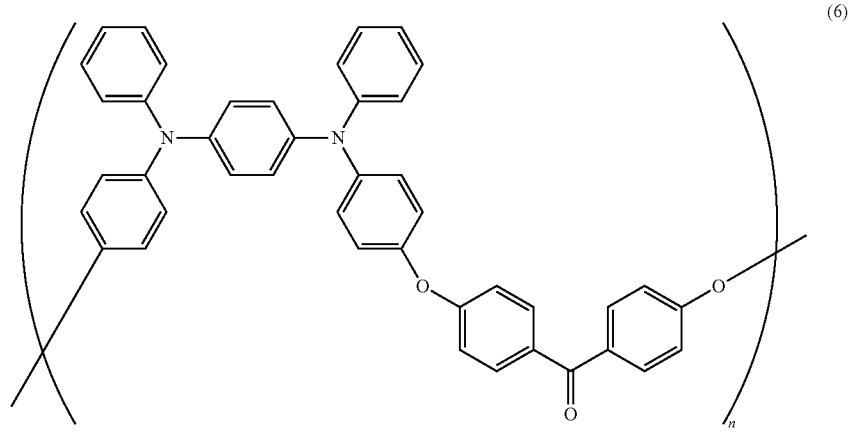

(6)

<Formation of Hole Transport Layer>

Next, a film of 4,4'-bis[N-(9-phenathryl)-N-phenylamino] biphenyl (PPD), which is represented by formula (2) given above, was formed by vacuum deposition in a thickness of 40 nm as a hole transport layer.

<Formation of Luminescent Layer>

Subsequently, a film of tris(8-hydroxyquinolinato)aluminum (Alq3) was formed by vacuum deposition in a thickness of 60 nm as a luminescent layer.

<Electron Injection Layer>

Subsequently, lithium fluoride (LiF) was vapor-deposited on the luminescent layer by vacuum deposition in a thickness of 0.5 nm to form an electron injection layer. The layers ranging from the hole injection layer to the electron injection layer were taken as an organic functional layer 3.

<Formation of Cathode>

Next, aluminum was vapor-deposited by vacuum deposition in a thickness of 80 nm to form a cathode 4.

air inclusion between the sealing layer and each of the aluminum foil and the hygroscopic layer, the sheet-form pressure-sensitive adhesive was press-bonded by pressing with a roller through the PET film on a 100° C. hot plate.

<Bonding of Organic Electroluminescence Element and Backing Member>

The PET film on the opposite side of the sealing layer to the side where a PET film had been peeled off previously was peeled off, and this backing member was applied by hand so that the pressure-sensitive surface of the sealing layer covered the luminescent layer of the organic electroluminescence element and that the edge of the hygroscopic layer protruded from the luminescent-region edge of the luminescent layer by 4 mm along horizontal directions. The resultant structure was placed on a 100° C. hot plate so that the glass-side surface of the organic electroluminescence element faced the hot plate, and the aluminum foil of the backing member was press-bonded with a roller. Subsequently, that region of the backing member which was outside the luminescent region and in which the hygroscopic layer had not been formed was further pressed with a roller to obtain the organic EL light-emitting device shown in FIG. 1. In this organic EL light-emitting device, the luminescent region of the luminescent layer is surrounded by the hygroscopic layer of an open-square shape so that a given distance is maintained between the outer periphery of the luminescent region and the hygroscopic layer.

Comparative Example 1

In Example 1, a moisture getter sheet (HD-S050914W-40; manufactured by Dynic Corp.) having a width of 0.9 cm and a length of 1.4 cm was applied, in place of the calcium oxide paste, to the aluminum foil, and four sheets (100 μm) of a pressure-sensitive adhesive (JTY-0806; manufactured by 3M) in the form of a 25 μm-thick thermoplastic sheet were stacked and applied thereto. The backing member thus obtained was bonded, in the same manner as in Example 1, to an organic electroluminescence element produced in the same manner as in Example 1. Thus, an organic EL light-emitting device was obtained. In this organic EL light-emitting device, the hygroscopic layer does not surround the luminescent region of the luminescent layer but is present only in some of the area which overlies the luminescent region.

Test Example 1

The organic EL light-emitting devices obtained in Example 1 and Comparative Example 1 were subjected to a storage test in a thermo-hygrostatic chamber of 85° C. and 85% RH, and the resultant shrink width was measured using an industrial microscope (ECLIPSE LV100D, manufactured by NiKon). The results thereof are shown in Table 1.

TABLE 1

| | Duration of storage at 85° C. and 85% RH | Shrink width |
|---|---|---|
| Example 1 | 2,500 hours | 60 μm |
| Comparative Example 1 | 960 hours | that part of the luminescent region over which the hygroscopic layer was absent became not luminescent |

Table 1 shows the following. The organic EL light-emitting device of Example 1 was stored in a thermo-hygrostatic chamber of 85° C. and 85% RH. As a result, after 2,500 hours, the shrink width was 60 μm and no abnormality was observed in the luminescent surface. Meanwhile, in the organic EL light-emitting device of Comparative Example 1, that part of the luminescent region over which the hygroscopic layer was absent became not luminescent after 960 hours had passed. This is presumed to be because the moisture which was permeating the thermoplastic resin was insufficiently diffused and, hence, some of the moisture undesirably reached the organic functional layer without being absorbed by the moisture getter sheet serving as a moisture absorbent.

Example 2

The organic EL light-emitting device shown in FIG. 2 was produced by the following method.

First, an organic electroluminescence element having a 7-mm-square luminescent region was produced in the manner shown in FIG. 3. The method for producing the organic electroluminescence element is the same as in Example 1.

Next, a backing member was produced in the manner shown in FIG. 5.

<Formation of Hygroscopic Layer>

An aluminum foil having a thickness of 100 μm was cut into a 100-mm square. DryPaste-S1 (manufactured by Saes Getters), which included calcium oxide as the main component, was used as a desiccant to form a hygroscopic layer having a square shape with a thickness of 50 μm and a side length of 18 mm on the cut aluminum foil in the air by means of a screen printing machine (HP-300, manufactured by Newlong Seimitsu Kogyo Co., Ltd.). Immediately after the printing, the aluminum foil was transferred to a nitrogen atmosphere and baked on a hot plate at 200° C. for 30 minutes. This aluminum foil was cut into a square with a side length of 22 mm so that the hygroscopic layer was located at the center.

<Formation of Sealing Layer>

A 50 μm-thick sheet-form pressure-sensitive adhesive sandwiched between two PET films was cut into 22-mm squares, the pressure-sensitive adhesive being a thermoplastic resin NE-1 obtained by mixing polyisobutylene with a cyclopentadiene/dicyclopentadiene copolymer in a mass ratio of 28:72. Thereafter, the PET film on one side was peeled off, and two sheets (100 μm) of the sheet-form pressure-sensitive adhesive obtained by coating the thermoplastic resin NE-1 were stacked and applied to the aluminum foil so that the resultant sealing layer covered the whole surface of the hygroscopic layer and that the edge of the sealing layer protruded from the edge of the hygroscopic layer by 2 mm along horizontal directions, thereby forming a sealing layer. In order to obtain close contact while avoiding air inclusion between the sealing layer and each of the aluminum foil and the hygroscopic layer, the sheet-form pressure-sensitive adhesive was press-bonded by pressing with a roller through the PET film on a 100° C. hot plate.

<Bonding of Organic Electroluminescence Element and Backing Member>

The PET film of the sealing layer was peeled off, and this backing member was applied by hand so that the pressure-sensitive surface of the sealing layer covered the luminescent layer of the organic electroluminescence element and that the edge of the hygroscopic layer protruded from the edge of the luminescent region of the luminescent layer by 1 mm along horizontal directions. The resultant structure was placed on a 100° C. hot plate so that the glass-side surface of the organic electroluminescence element faced the hot plate, and the aluminum foil of the backing member was press-bonded with a roller. Subsequently, that region of the backing member which was outside the luminescent region and in which the hygroscopic layer had not been formed was further pressed with a roller to obtain the organic EL light-emitting device shown in FIG. 2. In this organic EL light-emitting device, the luminescent region of the luminescent layer is wholly covered with the hygroscopic layer, which has a square shape larger by 1 mm than the outer periphery of the luminescent region of the luminescent layer.

Example 3

The organic EL light-emitting device shown in FIG. 2 was obtained in the same manner as in Example 2, except that in place of the 50 μm-thick sheet-form pressure-sensitive adhesive which was a thermoplastic resin NE-1 sandwiched between two PET films, use was made of a 50 μm-thick sheet-form pressure-sensitive adhesive sandwiched between two PET films and constituted of a thermoplastic resin NE-2 obtained by mixing polyisobutylene, a cyclopentadiene/dicyclopentadiene copolymer, and polybutene in a mass ratio of 23:58:19.

Test Example 2

The organic EL light-emitting devices obtained in Examples 2 and 3 were subjected to a storage test in a thermo-hygrostatic chamber of 60° C. and 90% RH, and the resultant shrink width was measured using an industrial microscope (ECLIPSE LV 100D, manufactured by Nikon). The results thereof are shown in Table 2.

TABLE 2

| | Sealing structure | Protective layer | Adhesive | Shrink width after 246-hour storage at 60° C. and 90% RH (μm) |
|---|---|---|---|---|
| Example 2 | FIG. 2 | aluminum foil | thermoplastic resin NE-1 | 1.5 |
| Example 3 | FIG. 2 | aluminum foil | thermoplastic resin NE-2 | 1.5 |

Test Example 3

The organic EL light-emitting device obtained in Example 2 was subjected to a storage test in a thermostatic chamber of 85° C., and the resultant shrink width was measured using an industrial microscope (ECLIPSE LV100D, manufactured by Nikon). As a result, the shrink width after 560-hour storage was found to be 10 μm or less.

Test Example 4

The organic EL light-emitting device obtained in Example 2 was subjected to a storage test in a thermostatic chamber of −20° C., and the resultant shrink width was measured using an industrial microscope (ECLIPSE LV100D, manufactured by Nikon). As a result, the shrink width after 250-hour storage was found to be 5 μm or less.

Example 4

An organic electroluminescence element having the structure shown in FIG. 1 was produced by the following method.

<Formation of Hole Injection Layer on ITO Substrate>

As an ITO substrate 1, use was made of a substrate constituted of a glass substrate 1 having a length of 3.75 cm, width of 2.5 cm, and thickness of 0.7 mm and a transparent conductive film of indium-tin oxide (ITO) with a thickness of 70 nm formed as an anode 2 on the glass substrate 1.

Subsequently, a polymeric compound PB-1 having the repeating structure shown below was mixed with 4-isopropyl-4'-ethyldiphenyliodonium tetrakis(pentafluorophenyl)borate in a weight ratio of 100:20, and this mixture was dissolved in ethyl benzoate so as to result in a concentration of the mixture of 2.0% by weight, thereby preparing a composition. In the air, this composition was applied to the ITO substrate 1 by spin coating in two stages including 2-second spin coating at a spinner rotation speed of 500 rpm and subsequent 30-second spin coating at a spinner rotation speed of 1,500 rpm. Thereafter, the coating film was heated at 230° C. for 15 minutes to thereby form a hole injection layer having a thickness of 30 nm.

[Chem. 7]

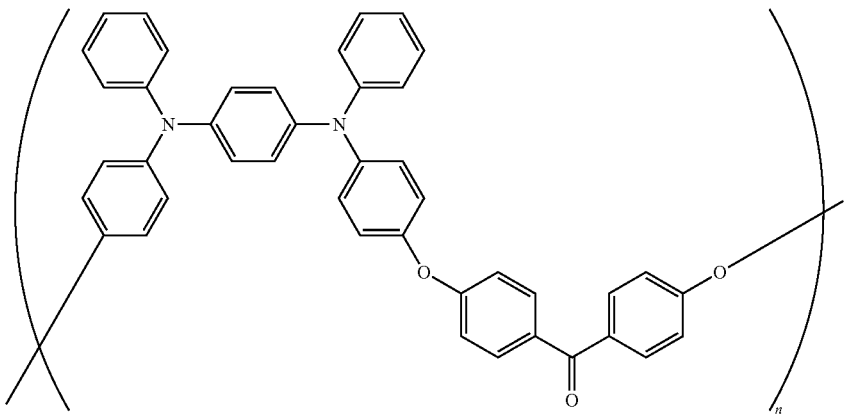

<Formation of Hole Transport Layer>

Next, a film of 4,4'-bis[N-(9-phenathryl)-N-phenylamino]biphenyl (PPD), which is represented by the following formula, was formed by vacuum deposition in a thickness of 40 nm as a hole transport layer.

[Chem. 8]

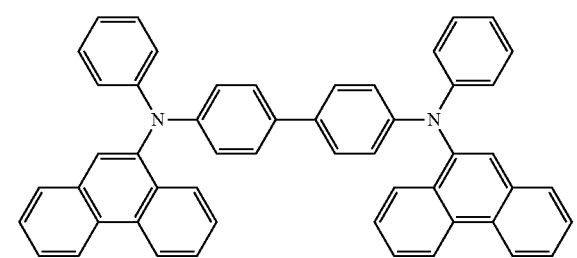

<Formation of Luminescent Layer>

Subsequently, a film of tris(8-hydroxyquinolinato)aluminum (Alq3) was formed by vacuum deposition in a thickness of 60 nm as a luminescent layer. The layers ranging from the hole injection layer to the luminescent layer were taken as an organic functional layer 3.

<Formation of Electron Injection Layer and Cathode>

Subsequently, lithium fluoride (LiF) was vapor-deposited on the luminescent layer by vacuum deposition in a thickness of 0.5 nm to form an electron injection layer. Thereafter, aluminum was vapor-deposited by vacuum deposition in a thickness of 80 nm to form a cathode 4.

Subsequently, a backing member was produced in the manner shown in FIGS. 1 and 2.

<Formation of Backing Member>

An aluminum foil having a thickness of 40 μm was cut into a 22-mm square for use as a protective layer. Subsequently, in $N_2$, a desiccant (Moist Catch CCA; manufactured by Kyodo Printing Co., Ltd.; thickness, 80 μm) was cut into a 18-mm square, and this cut piece was press-bonded to the center of the aluminum foil with heating at 120° C. to form a hygroscopic layer. In this stage, the 2 mm-wide area surrounding the periphery of the hygroscopic layer was occupied by the aluminum foil only. Next, the aluminum foil was placed on a flat table, with the desiccant facing downward, and that region of the aluminum foil in which the hygroscopic layer had not been formed was pressed with a roller to shape the protective layer in accordance with the shape of the hygroscopic layer. Thus, the protective layer and the hygroscopic layer were rendered approximately flush with each other. Subsequently, a 40-μm sheet of a mixture obtained by mixing polyisobutylene with a cyclopentadiene/dicyclopentadiene copolymer in a mass ratio of 1:1 was cut into a 22-mm square for use as a sealing layer, and the cut piece of the sheet was press-bonded with heating to the surface where the hygroscopic layer was exposed, thereby forming a backing member. In this backing member, the 2 mm-wide area surrounding the region where the hygroscopic layer had been formed was configured of the protective layer and the sealing layer only.

Examples 5 to 7 and Comparative Examples 2 and 3

Backing members were formed in the same manner as in Example 4, except that the thickness of the aluminum foil and the thickness of the pressure-sensitive adhesive were changed as shown below.

TABLE 3

| Example | Example 5 | Example 6 | Example 7 | Comparative Example 2 | Comparative Example 3 |
|---|---|---|---|---|---|
| Thickness of aluminum foil | 95 | 40 | 40 | 40 | 20 |
| Thickness of pressure-sensitive adhesive | 40 | 25 | 100 | 150 | 100 |

<Bonding of Organic Electroluminescence Element and Backing Member>

Each of the backing members thus obtained was disposed so that the sealing layer of the backing member covered the luminescent layer of the organic electroluminescence element and that the hygroscopic layer protruded from the outer periphery of the luminescent layer while maintaining a distance of 1 mm from the edge of the luminescent layer in directions parallel with the substrate. This stack was press-bonded with heating at 110° C. Thereafter, a frame-shaped hot-pressing member made of a polycarbonate was disposed on the whole 2 mm-wide region which surrounded the hygroscopic layer and in which the aluminum foil and the translucent substrate had been bonded to each other with the sealing layer, and the bonded stack was hot-pressed at 110° C. and 10 MPa by means of a hydraulic press to produce an organic EL light-emitting device. (In FIG. 3 and FIG. 8 (*c*), x=1.0 and y=2.0).

Test Example 5

The organic EL light-emitting devices obtained in Examples 4 to 7 and Comparative Examples 2 and 3 were subjected to an operation test at 65.3 mA/cm$^2$. The time periods (LT85) required for the decrease in luminance (L/L0) to become 0.85 were compared. In Table 4, the ratio between the thickness of the protective layer and the thickness of the sealing layer [(protective-layer thickness)/(sealing-layer thickness)] is shown as thickness ratio, and the relative value of the time period LT85 for each Example, with the LT85 for Comparative Example 1 being taken as 100, is shown as relative value of LT85.

TABLE 4

| | Thickness ratio | Relative value of LT85 |
|---|---|---|
| Example 4 | 1 | 100 |
| Example 5 | 2.4 | 122 |
| Example 6 | 1.6 | 97 |
| Example 7 | 0.4 | 102 |
| Comparative Example 2 | 0.27 | 86 |
| Comparative Example 3 | 0.2 | 69 |

Examples 8 to 12

Organic EL light-emitting devices were produced in the same manner as in Example 5, except that the hygroscopic layer was disposed so as to protrude from the outer periphery of the luminescent region while maintaining a distance of 0.5-3 mm between the hygroscopic layer and the edge of the luminescent region in directions parallel with the substrate. (In FIG. 3 and FIG. 8 (*c*), x=0.5 to 3.0 and y=2.0)

Comparative Examples 4 to 7

Organic EL light-emitting devices were produced in the same manner as in Example 5, except that the hygroscopic layer was disposed so as to protrude from the outer periphery of the luminescent region while maintaining a distance of −0.5 to 0.3 mm between the hygroscopic layer and the edge of the luminescent region in directions parallel with the substrate. (In FIG. 3 and FIG. 8 (*c*), x=−0.5 to 0.3 and y=2.0)

Test Example 6

The organic EL light-emitting devices obtained in Examples 8 to 12 and Comparative Examples 4 to 7 were subjected to a storage test in which the light-emitting devices were stored in a thermo-hygrostatic chamber of 85° C. and 85% RH for 315 hours. These elements were caused to emit light, and the resultant shrink width was measured in the same manner as in Example 1.

TABLE 5

| | Hygroscopic-layer protrusion width | Shrink (μm) |
|---|---|---|
| Example 8 | 0.5 | 2.2 |
| Example 9 | 1.0 | 2.7 |
| Example 10 | 1.5 | 4.4 |
| Example 11 | 2.0 | 0.9 |
| Example 12 | 3.0 | 4.7 |
| Comparative Example 4 | −0.5 | >500 |
| Comparative Example 5 | −0.1 | >500 |
| Comparative Example 6 | 0.0 | >500 |
| Comparative Example 7 | 0.3 | 30 |

Example 13

An organic EL light-emitting device was produced in the same manner as in Example 5. The thickness of the sealing layer in the region which had undergone the hot pressing was 14 μm, and the amount in which the protective layer had been depressed was 26 μm.

Comparative Example 8

An organic EL light-emitting device was produced in the same manner as in Example 5, except that after the backing member and the organic electroluminescence element were press-bonded to each other with heating at 110° C., hot pressing at 110° C. and 10 MPa was omitted. Since the hot pressing had been omitted, the amount in which the protective layer had been depressed was 0 μm.

Test Example 7

The organic EL light-emitting devices obtained in Example 13 and Comparative Example 8 were subjected to a storage test in which the light-emitting devices were stored in a thermo-hygrostatic chamber of 85° C. and 85% RH for 287 hours, and the resultant shrink width was measured in the same manner as in Test Example 2.

TABLE 6

| | Example 13 | Comparative Example 8 |
|---|---|---|
| Hot pressing | conducted | omitted |
| Protective-layer depression amount | 26 μm | 0 |
| Shrink width | 2 μm | >300 μm |

It can be seen from Test Example 5 that long and satisfactory service lives are obtained in the case where the value of (protective-layer thickness)/(sealing-layer thickness) is 0.4 or larger.

It can be seen from Test Example 6 that small and satisfactory shrink widths result in the case where the width by which the hygroscopic layer protrudes from the luminescent region in directions parallel with the substrate is 0.5 μm or larger.

It can be seen from Test Example 7 that small and satisfactory shrink widths result in the case where the protective layer has been depressed by hot pressing to reduce the thickness of the sealing layer.

While the invention has been described in detail and with reference to specific embodiments thereof, it will be apparent to one skilled in the art that various changes and modifications can be made therein without departing from the spirit and scope thereof This application is based on a Japanese patent application filed on Aug. 5, 2011 (Application No. 2011-172178), the contents thereof being incorporated herein by reference.

DESCRIPTION OF THE REFERENCE NUMERALS AND SIGNS

1 Translucent substrate
2 First electrode
2a Takeout electrode for second electrode
3 Organic functional layer
3a Luminescent-region edge of luminescent layer constituting organic functional layer 3
4 Second electrode
5 Sealing layer
5a Edge of sealing layer 5
6 Hygroscopic layer
6a Edge of hygroscopic layer 6
7 Protective layer
10 Organic EL light-emitting device
15 Adhesive
16 Desiccant
17 Sealing can
20 Organic EL light-emitting device
30 Organic EL light-emitting device
31 Stage
32 Roller
33 Hot-pressing member
x Horizontal distance from luminescent-region edge 3a of luminescent layer to edge 6a of hygroscopic layer 6
y Horizontal distance from edge 6a of hygroscopic layer 6 to edge 5a of sealing layer 5
α Thickness of protective layer 7
β Initial thickness of sealing layer 5
γ Thickness of sealing layer 5 after hot pressing

The invention claimed is:

1. An organic electroluminescence light-emitting device, comprising:
a translucent substrate;
a first electrode formed on the translucent substrate;
an organic functional layer formed on the first electrode and including at least a luminescent layer;
a second electrode formed on the organic functional layer;
a sealing layer which comprises a thermoplastic resin and has been formed so as to cover at least the surfaces of the first electrode, second electrode and organic functional layer;
a protective layer having flexibility and formed over the sealing layer; and
a hygroscopic layer which contains a desiccant and which has been disposed between the protective layer and the sealing layer and formed so as to surround at least a luminescent region of the luminescent layer,
wherein the edge of the hygroscopic layer protrudes, along a horizontal direction, from the edge of the luminescent region by 0.4 mm or longer and is shorter than the edge of the sealing layer, and
that region of the sealing layer, which is outside the edge of the luminescent region in which the hygroscopic layer is not formed, has a thickness that is smaller than the thickness of the sealing layer which is located over the luminescent region.

2. The organic electroluminescence light-emitting device of claim 1, wherein that thickness of the protective layer which is located over the luminescent region is at least 0.3 times the thickness of the sealing layer which is located over the luminescent region.

3. The organic electroluminescence light-emitting device of claim 1, wherein the horizontal distance from the edge of the hygroscopic layer to the edge of the sealing layer is 0.1 mm or longer.

4. The organic electroluminescence light-emitting device of claim 1, wherein the hygroscopic layer contains at least one member selected from alkaline earth metals, alkali metals and oxides thereof, and inorganic porous materials.

5. The organic electroluminescence light-emitting device of claim 1, wherein the hygroscopic layer has a thickness of 0.1-500 µm.

6. The organic electroluminescence light-emitting device of claim 1, wherein the sealing layer has a thickness of 1-200 µm.

7. The organic electroluminescence light-emitting device of claim 1, wherein the sealing layer has a thickness of 10-100 µm.

8. The organic electroluminescence light-emitting device of claim 1, wherein the protective layer has a thickness of 10-200 µm.

9. A process for producing an organic electroluminescence light-emitting device, the process comprising, in the following order:
    forming an organic functional layer including at least a luminescent layer on a first electrode of a translucent substrate having the first electrode formed thereon, and subsequently forming a second electrode on the organic functional layer, to obtain an organic electroluminescence element;
    forming a hygroscopic layer containing a desiccant on a flexible sheet serving as a protective layer;
    forming a sealing layer having a thickness of 3.3 times or less the thickness of the protective layer and comprising a thermoplastic resin on the hygroscopic layer, to obtain a backing member; and
    superimposing and heat-treating the surface of the organic electroluminescence element on which the second electrode has been formed and the surface of the backing member on which the sealing layer has been formed, so that the hygroscopic layer surrounds at least a luminescent region of the luminescent layer and that the edge of the hygroscopic layer protrudes, along a horizontal direction, from the edge of the luminescent region of the luminescent layer by 0.4 mm or more,
    wherein that region of the sealing layer, which is outside the edge of the luminescent region in which the hygroscopic layer is not formed, has a thickness that is smaller than the thickness of the sealing layer which is located over the luminescent region.

10. An organic electroluminescence light-emitting device produced by a production process comprising, in the following order:
    forming an organic functional layer including at least a luminescent layer on a first electrode of a translucent substrate having the first electrode formed thereon, and subsequently forming a second electrode on the organic functional layer, to obtain an organic electroluminescence element;
    forming a hygroscopic layer containing a desiccant on a flexible sheet serving as a protective layer;
    forming a sealing layer having a thickness of 3.3 times or less the thickness of the protective layer and comprising a thermoplastic resin on the hygroscopic layer, to obtain a backing member; and
    superimposing and heat-treating the surface of the organic electroluminescence element on which the second electrode has been formed and the surface of the backing member on which the sealing layer has been formed, so that the hygroscopic layer surrounds at least a luminescent region of the luminescent layer and that the edge of the hygroscopic layer protrudes, along a horizontal direction, from the edge of the luminescent region of the luminescent layer by 0.4 mm or more,
    wherein that region of the sealing layer, which is outside the edge of the luminescent region in which the hygroscopic layer is not formed, has a thickness that is smaller than the thickness of the sealing layer which is located over the luminescent region.

11. An organic electroluminescence display device comprising the organic electroluminescence light-emitting device of claim 10.

12. An organic electroluminescence lighting device comprising the organic electroluminescence light-emitting device of claim 10.

13. An organic electroluminescence electrical apparatus comprising the organic electroluminescence light-emitting device of claim 10.

* * * * *